(12) United States Patent
Ongayi et al.

(10) Patent No.: US 9,206,276 B2
(45) Date of Patent: Dec. 8, 2015

(54) PHOTOSENSITIVE COPOLYMER, PHOTORESIST COMPRISING THE COPOLYMER, AND METHOD OF FORMING AN ELECTRONIC DEVICE

(71) Applicant: ROHM AND HAAS ELECTRONIC MATERIALS LLC, Marlborough, MA (US)

(72) Inventors: Owendi Ongayi, Marlborough, MA (US); James W. Thackeray, Braintree, MA (US); James F. Cameron, Brookline, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 14/186,371

(22) Filed: Feb. 21, 2014

(65) Prior Publication Data

US 2014/0242521 A1    Aug. 28, 2014

Related U.S. Application Data

(60) Provisional application No. 61/768,785, filed on Feb. 25, 2013.

(51) Int. Cl.
*G03F 7/039* (2006.01)
*C08F 22/10* (2006.01)
(Continued)

(52) U.S. Cl.
CPC .............. *C08F 220/10* (2013.01); *C08F 220/30* (2013.01); *C08F 220/32* (2013.01);
(Continued)

(58) Field of Classification Search
None
See application file for complete search history.

(56) References Cited

U.S. PATENT DOCUMENTS 6,680,157 B1   1/2004   Fedynyshyn
6,878,502 B2   4/2005   Mizutani et al.
(Continued)

FOREIGN PATENT DOCUMENTS

EP   2020616 A2    4/2009
JP   2007-256347   * 10/2007
(Continued)

OTHER PUBLICATIONS

Eschbaumer, Christian et al., "Chemically Amplified Main Chain Scission:New Concept to Reduce Line Edge Roughness and Outgassing", Journal of Photopolymer Science and Technology, V.15, No. 4, 2002, pp. 673-676.
(Continued)

*Primary Examiner* — Martin Angebranndt
(74) *Attorney, Agent, or Firm* — Cantor Colburn LLP

(57) ABSTRACT

A copolymer includes the polymerized product of a comonomer and a monomer having the formula (I):

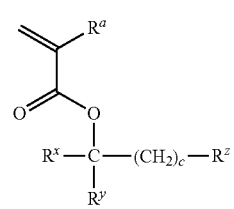

wherein c is 0, 1, 2, 3, 4, or 5; $R^a$ is H, F, —CN, $C_{1-10}$ alkyl, or $C_{1-10}$ fluoroalkyl; $R^x$ and $R^y$ are each independently an unsubstituted or substituted $C_{1-10}$ linear or branched alkyl group, an unsubstituted or substituted $C_{3-10}$ cycloalkyl group, an unsubstituted or substituted $C_{3-10}$ alkenylalkyl group, or an unsubstituted or substituted $C_{3-10}$ alkynylalkyl group; wherein $R^x$ and $R^y$ together optionally form a ring; and $R^z$ is a $C_{6-20}$ aryl group substituted with an acetal-containing group or a ketal-containing group, or a $C_3$-$C_{20}$ heteroaryl group substituted with an acetal-containing group or a ketal-containing group, wherein the $C_{6-20}$ aryl group or the $C_3$-$C_{20}$ heteroaryl group can, optionally, be further substituted. Also described are a photoresist including the copolymer, a coated substrate having a layer of the photoresist, and a method of forming an electronic device utilizing the photoresist.

9 Claims, 2 Drawing Sheets

(51) Int. Cl.
  *C08F 22/14* (2006.01)
  *C08F 220/10* (2006.01)
  *C08F 220/30* (2006.01)
  *C08F 220/32* (2006.01)
  *C08F 220/36* (2006.01)
  *G03F 7/004* (2006.01)

(52) U.S. Cl.
  CPC ............ *C08F220/36* (2013.01); *G03F 7/0045* (2013.01); *G03F 7/0046* (2013.01); *G03F 7/0392* (2013.01); *G03F 7/0397* (2013.01)

(56) References Cited

U.S. PATENT DOCUMENTS

| | | | |
|---|---|---|---|
| 7,022,455 | B2 | 4/2006 | Barclay et al. |
| 7,361,444 | B1 | 4/2008 | Angelopoulos et al. |
| 2003/0134224 | A1 | 7/2003 | Mizutani et al. |
| 2003/0232274 | A1 | 12/2003 | Barclay et al. |
| 2008/0102407 | A1 | 5/2008 | Ohsawa et al. |
| 2010/0129738 | A1 | 5/2010 | Takemura et al. |
| 2010/0196828 | A1 | 8/2010 | Kawamura |
| 2010/0310987 | A1 | 12/2010 | Maruyama et al. |
| 2011/0294070 | A1 | 12/2011 | Hatakeyama et al. |
| 2012/0328983 | A1 | 12/2012 | Kramer |
| 2013/0115556 | A1 | 5/2013 | Iwato et al. |

FOREIGN PATENT DOCUMENTS

| | | | |
|---|---|---|---|
| JP | 2007-256641 | * | 10/2007 |
| JP | 2007-279699 | * | 10/2007 |
| JP | 2008-076747 | * | 4/2008 |
| JP | 2008-102509 | * | 5/2008 |
| JP | 2009-073835 | * | 4/2009 |
| JP | 2010230894 | A | 10/2010 |
| JP | 2012-128067 | * | 7/2012 |

OTHER PUBLICATIONS

Furukawa, Kikuo, et al. "Evaluation of adamantane derivatives for chemically amplified resist—a comparioson between ArF, EUV and EB exposures", Advances in Resist Materials and Processing Technology XXV, Proc. of SPIE, vol. 692334, 2008, pp. 692334-1-692334-12.

Gronheid, Roel, et al., "EUV Resist Requirements: Absorbance and Acid Yield", Advances in Resist Materials and Processing Technology XXV, Proc. of SPIE, I, vol. 7273, 2009, pp. 727332-1-727332-8.

Hirayama, Taku et al., "New Photoresist Based on Amorphous Low Molecular Weight Polyphenols", Journal of Photopolymer Science and Technology, vol. 17, No. 3, 2004, pp. 435-440.

Huang, Wu-Song et al., "Evaluation of a New Environmentally Stable Positive Tone Chemically Amplified Deep-UV Resist", Advances in Resist Technology and Processing XI, Proc. of SPIE, vol. 2195, Feb. 28-Mar. 1, 1994, pp. 37-46.

Ito, Hiroshi, "Chemical Amplification Resists for Microlithography", Adv Polym Sci , 172, 2005 pp. 37-245.

Kitai, M.S. et al., "Increasing of the EUV resist's sensitivity", Fundamentals of Laser-Assisted Micro and Nanotechnologies 2010, Proc. of SPIE, vol. 7996, 2011, pp. 799612-1-799612-10.

Kojima, Kyoko et al., "Characterization of Negative-Tone Molecular Resist for EUV and EB Lithography", Journal of Photopolymer Science and Technology, vol. 20, No. 3, 2007, pp. 429-436.

Pinnow, Matthew J. et al., "Development of Mass Persistent Photoresists", University of Texas, Austin, downloaded on Jun. 10, 2014, http://willson.cm.utexas.edu/Research/Sub_Files/Mass_Persist/Files/157_2nd_Symp_MassPersist.PDF, 1 page.

Pollentier, I., et al., "Assessment of Resist Outgassing related EUV optics Contamination for CAR and non-CAR material chemistries", Advances in Resist Materials and Processing Technology XXVIII, Proc. of SPIE, vol. 7972, 2011, pp. 797201-1-797208-11.

Santillan, Julius Joseph, et al., "Fluorinated-Polymer Based High Sensitivity Extreme Ultraviolet Resists", Japanese Journal of Applied Physics 49, (2010), pp. 06GF01-1-06GF01-4.

DN7647385 Shimizu, Dalsuke et al., "Progress in EUV Resist Development", Journal of Photopolymer Science and Technology, vol. 20, No. 3, 2007, pp. 423-428.

Takahiro, Kozawa et al., "Latent image formation in chemically amplified extreme ultraviolet resists with low activation energy for deprotection reaction", J. Vac. Sci. Technol. B 26(6), Nov./Dec. 2008, American Vacuum Society, pp. 2257-2260.

Takemoto, Ichiki et al., Tailoring Surface Properties of ArF Resists with Functinally Graded Materials (FGM), Journal of Photopolymer Science and Technology, vol. 20, No. 3, 2007, pp. 473-480.

Tarutani, Shinji et al., "Study on Approaches for Improvement of EUV-resist Sensitivity", Journal of Photopolymer Science and Technology, vol. 23, No. 5, 2010, pp. 693-698.

Thackeray, James et al. "Chemically Amplified Resists Resolving 25nm 1:1 Line:Space Features with EUV Lithography", Emerging Lithographic Technologies XI, Proc. of SPIE vol. 6517, 2007 pp. 651719-1-651719-11.

Thackeray, J.W. et al., "Evaluation of High and Low Activation Resistsf for EUV Lithography", Journal of Photopolymer Science and Technology, 2006, vol. 19, No. 4, pp. 525-531.

Jain, Vipul et al., "Impact of Polymerization Process and OOB on Lithographic Performance of a EUV Resist", Extreme Ultraviolet (EUV) Lithography II, Proc. of SPIE, vol. 7969, 2011, pp. 796912-1-796912-10.

Yamamoto, Hiroki, et al., "Enhancement of Acid Production in Chemically Amplified Resist for Extreme Ultraviolet Lithography", Applied Physics Express 1 (2008) , The Japan Society of Applied Physics, pp. 047001-1-047001-3.

Yamashita, Tsuneo et al., "High-sensitivity EUV resists based on Fluorinated polymers", Advances in Resist Materials and Processing Technology XXVIII, Proc. of SPIE, vol. 7972, 79721G, 2011.

* cited by examiner

PHOTOSENSITIVE COPOLYMER, PHOTORESIST COMPRISING THE COPOLYMER, AND METHOD OF FORMING AN ELECTRONIC DEVICE

FIELD

The present invention relates to a photosensitive copolymer useful in photoresist compositions.

INTRODUCTION

Photoresists for electron beam and extreme ultraviolet (EUV) lithographies preferably exhibit high sensitivity. Optimization of current chemically amplified resist has proven to be challenging. And sensitivity has increasingly become more important to improve device manufacturing throughput and compensate for the low power of EUV sources.

Protecting groups (leaving groups) of chemically amplified resists (CAR) play an important role in obtaining good lithographic performance. This is because the reactivity of the leaving group is a factor that affects the resist's sensitivity and resolution. See, e.g., H. Ito, "Chemical amplification resists for microlithography" *Adv. Polym. Sci.* 2005, volume 172, pages 37-245. Previous work demonstrated that that a blend of high and low activation resist polymers could provide a desirable balance of resolution and sensitivity. J. W. Thackeray, R. A. Nassar, K. Spear-Alfonso, T. Wallow, and B. LaFontaine, "Evaluation of High and Low Activation Resists for EUV Lithography", *Journal of Photopolymer Science and Technology* 2006, volume 19, number 4, pages 525-531. However, there remains a desire for photoresists that exhibit improved sensitivity.

SUMMARY

One embodiment is a copolymer comprising the polymerized product of: an acid-deprotectable monomer having the formula (I) and a comonomer

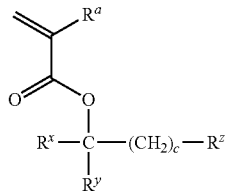

(I)

wherein c is 0, 1, 2, 3, 4, or 5; $R^a$ is H, F, —CN, $C_{1-10}$ alkyl, or $C_{1-10}$ fluoroalkyl; $R^x$ and $R^y$ are each independently an unsubstituted or substituted $C_{1-10}$ linear or branched alkyl group, an unsubstituted or substituted $C_{3-10}$ cycloalkyl group, an unsubstituted or substituted $C_{3-10}$ alkenylalkyl group, or an unsubstituted or substituted $C_{3-10}$ alkynylalkyl group; wherein $R^x$ and $R^y$ together optionally form a ring; and $R^z$ is a $C_{6-20}$ aryl group substituted with an acetal-containing group or a ketal-containing group, or a $C_3$-$C_{20}$ heteroaryl group substituted with an acetal-containing group or a ketal-containing group, wherein the $C_{6-20}$ aryl group or the $C_3$-$C_{20}$ heteroaryl group can, optionally, be further substituted.

Another embodiment is a photoresist composition comprising the copolymer.

Another embodiment is a method of forming an electronic device, comprising: (a) applying a layer of the photoresist composition of claim 8 on a substrate; (b) patternwise exposing the photoresist composition layer to activating radiation; and (c) developing the exposed photoresist composition layer to provide a resist relief image.

These and other embodiments are described in detail below.

DETAILED DESCRIPTION

Figure 1:
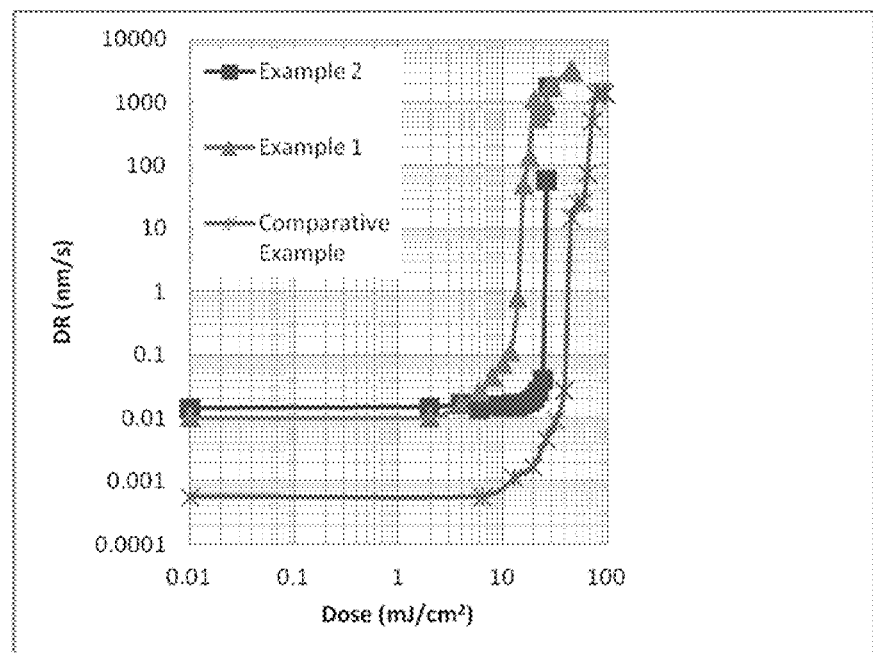
FIG. 1 is a plot of dissolution rate (DR), expressed in units of nanometers/second, as a function of dose, expressed in units of millijoules/centimeter².

The present inventors have determined that increased sensitivity is provided by photoresist compositions comprising a copolymer comprising the residue of a monomer comprising an ester with a tertiary leaving group having an aryl group bound to the tertiary carbon, wherein the aryl group is substituted with an acetal, a ketal, an acetal-containing group, or a ketal-containing group. The tertiary ester group can react in the presence of acid to form a carboxylic acid, and the acetal and ketal groups can react in the presence of acid to form free hydroxyl groups. The carboxylic acid and the hydroxyl groups increase the solubility of the copolymer in developer.

Thus, one embodiment is a copolymer comprising the polymerized product of: an acid-deprotectable monomer having the formula (I) and a comonomer:

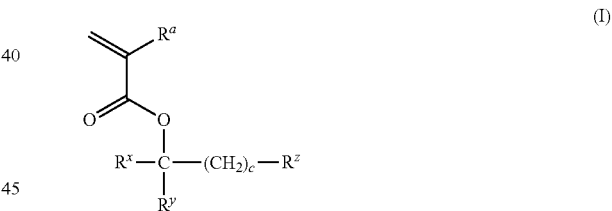

(I)

wherein c is 0, 1, 2, 3, 4, or 5; $R^a$ is H, F, —CN, $C_{1-10}$ alkyl, or $C_{1-10}$ fluoroalkyl; $R^x$ and $R^y$ are each independently an unsubstituted or substituted $C_{1-10}$ linear or branched alkyl group, an unsubstituted or substituted $C_{3-10}$ cycloalkyl group, an unsubstituted or substituted $C_{3-10}$ alkenylalkyl group, or an unsubstituted or substituted $C_{3-10}$ alkynylalkyl group; wherein $R^x$ and $R^y$ together optionally form a ring; and $R^z$ is a $C_{6-20}$ aryl group substituted with an acetal-containing group or a ketal-containing group, or a $C_3$-$C_{20}$ heteroaryl group substituted with an acetal-containing group or a ketal-containing group, wherein the $C_{6-20}$ aryl group or the $C_3$-$C_{20}$ heteroaryl group can, optionally, be further substituted.

As used herein "onium" refers to iodonium or sulfonium cations. Also as used herein, "substituted" means including a substituent such as a halogen (i.e., F, Cl, Br, I), hydroxyl, amino, thiol, carboxyl, carboxylate, amide, nitrile, thiol, sulfide, disulfide, nitro, $C_{1-10}$ alkyl, $C_{1-10}$ alkoxy, $C_{6-10}$ aryl, $C_{6-10}$ aryloxy, $C_{7-10}$ alkylaryl, or $C_{7-10}$ alkylaryloxy, or a combination of at least two of the foregoing. It will be understood that any group or structure disclosed with respect to the formulas herein may be so substituted unless otherwise specified, or where such substitution would significantly adversely affect the desired properties of the resulting structure. Also, "(meth)acrylate," as used herein, means either acrylate or methacrylate, and is not limited to either of these unless otherwise specified. In addition, "fluorinated" means having one or more fluorine atoms incorporated into the group. For example, where a $C_{1-10}$ fluoroalkyl group is indicated, the fluoroalkyl group can include one or more fluorine atoms, for example, a single fluorine atom, two fluorine atoms (e.g., as a difluoromethylene group), three fluorine atoms (e.g., as a trifluoromethyl group), or fluorine atoms at each free valence of carbon (e.g., as a perfluorinated group such as $CF_3$, $C_2F_5$, $C_3F_7$, or $C_4F_9$), or a combination of at least two of the foregoing.

In formula (I) above, $R^a$ is H, F, —CN, $C_{1-10}$ alkyl, or $C_{1-10}$ fluoroalkyl. A specific example of $R^a$ is methyl.

Also in formula (I), $R^x$ and $R^y$ are each independently an unsubstituted or substituted $C_{1-10}$ linear or branched alkyl group, an unsubstituted or substituted $C_{3-10}$ cycloalkyl group, an unsubstituted or substituted $C_{3-10}$ alkenylalkyl group, or an unsubstituted or substituted $C_{3-10}$ alkynylalkyl group, wherein $R^x$ and $R^y$ together optionally form a ring. A specific example of $R^x$ is methyl.

In some embodiments, $R^y$ is unsubstituted $C_{2-6}$ linear alkyl, fluorine-substituted $C_{3-6}$ linear alkyl, unsubstituted $C_{3-6}$ alkenylalkyl, or unsubstituted $C_{3-10}$ alkynylalkyl group. Specific examples of unsubstituted $C_{2-6}$ linear alkyl groups are ethyl and 1-propyl. A specific example of a fluorine-substituted $C_{3-6}$ linear alkyl is 3,3,3-trifluoropropyl. Specific examples of unsubstituted $C_{3-6}$ alkenylalkyl include allyl (—$CH_2$—CH=$CH_2$) and 2,4-pentadienyl (—$CH_2$—CH=CH—CH=$CH_2$). A specific example of an unsubstituted $C_{3-10}$ alkynylalkyl group is propargyl (—$CH_2$—C≡CH).

Also in formula (I), $R^z$ is a $C_{6-20}$ aryl group substituted with an acetal-containing group or a ketal-containing group, or a $C_3$-$C_{20}$ heteroaryl group substituted with an acetal-containing group or a ketal-containing group, wherein the $C_{6-20}$ aryl group or the $C_3$-$C_{20}$ heteroaryl group can, optionally, be further substituted. The $C_{6-20}$ aryl group nucleus can be, for example, phenyl, 1-naphthyl, 2-naphthyl, 1-anthracenyl, 2-anthracenyl, 9-anthracenyl, 1-phenanthrenyl, 2-phenanthrenyl, 9-phenanthrenyl, 1-methyl-3H-phenalene, and 2-methyl-3H-phenalene. In some embodiments, the $C_{6-20}$ aryl group nucleus is phenyl. In some embodiments, the $C_{6-20}$ aryl group nucleus is 1-naphthyl.

$R^z$ is substituted with an acetal-containing group or a ketal-containing group. In some embodiments, at least one oxygen atom of the acetal or ketal moiety is directly bonded to the $C_{6-20}$ aryl group or the $C_3$-$C_{20}$ heteroaryl group. Examples of $R^z$ substituted with an acetal or a ketal include

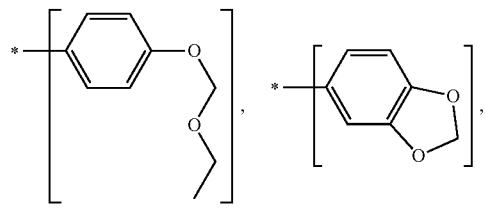

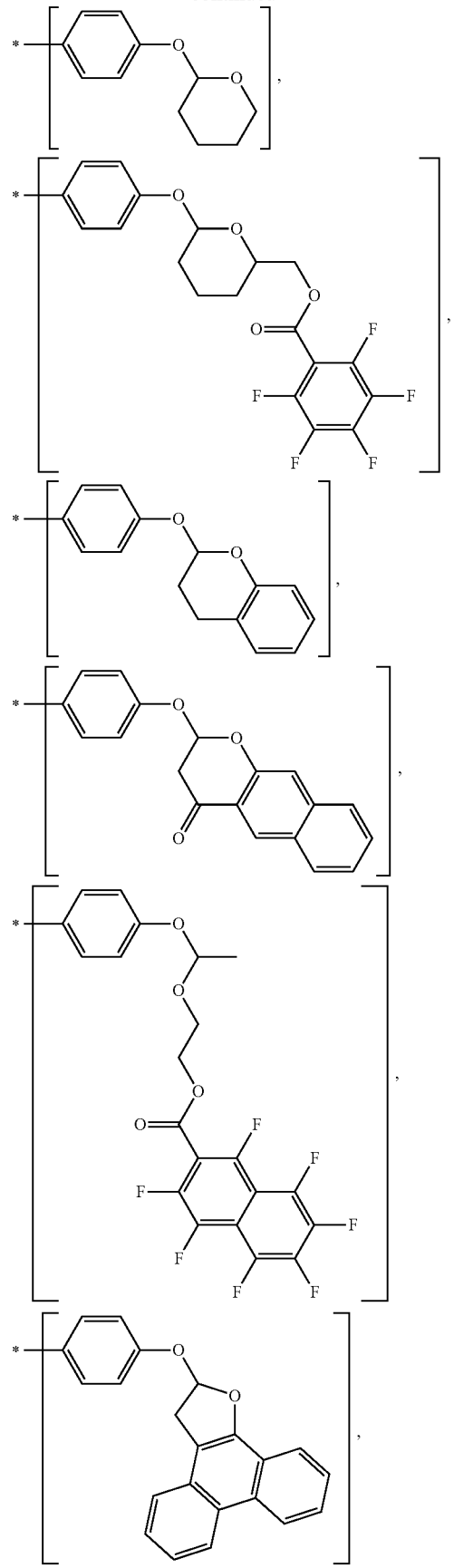

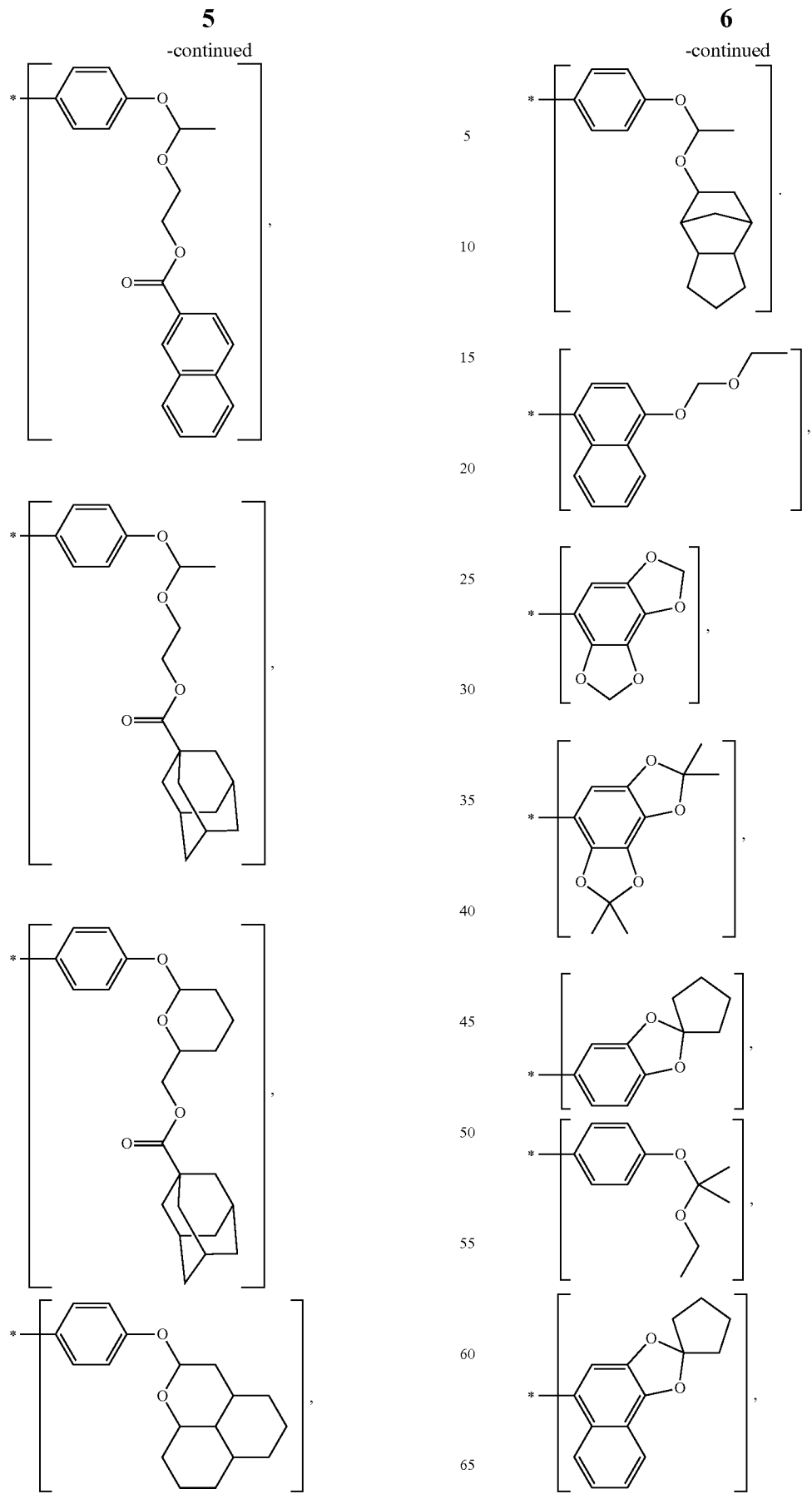

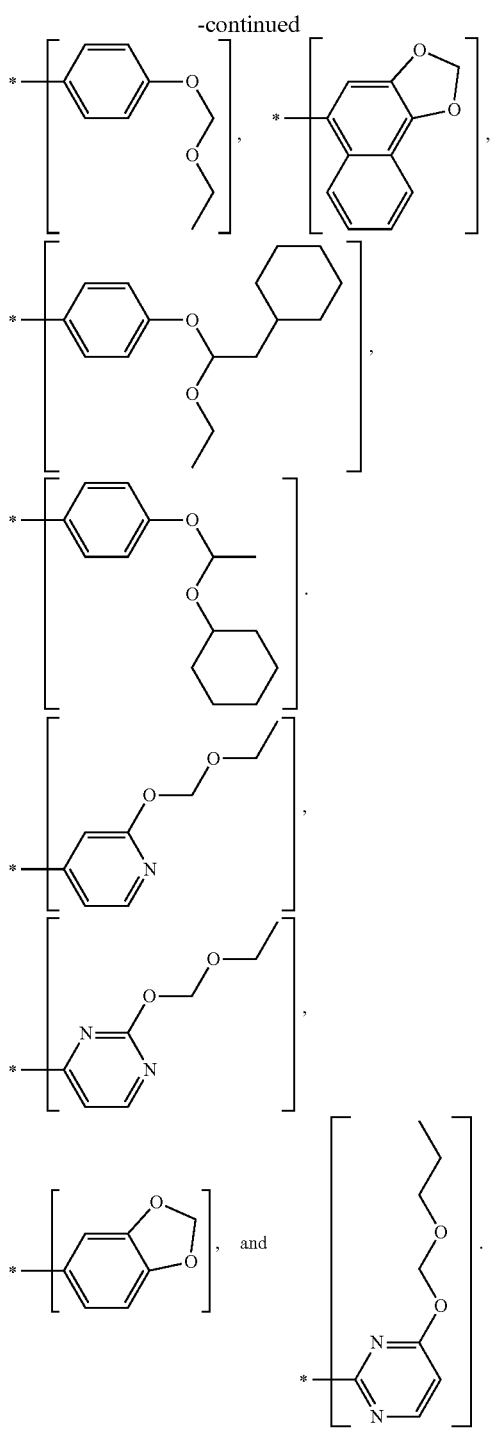

acetals, ketals, and tertiary esters. Thus, the acid-deprotectable monomer can include, for example, two acetal groups, two ketal groups, an acetal group and a ketal group, an acetal group and a tertiary ester, or a ketal group and a tertiary ester. The first acid-deprotectable group is the acetal or a ketal present in $R^z$. The second and any additional acid-deprotectable groups can be present as part of $R^x$, $R^y$, or $R^z$. Examples of $R^z$ groups that include an acid-sensitive group in addition to the acetal or ketal include In addition to being substituted with an acetal-containing group or a ketal-containing group, the $C_{6-20}$ aryl group can, optionally, be further substituted. As described above, "substituted" means including a substituent such as a halogen (i.e., F, Cl, Br, I), hydroxyl, amino, thiol, carboxyl, carboxylate, amide, nitrile, thiol, sulfide, disulfide, nitro, $C_{1-10}$ alkyl, $C_{1-10}$ alkoxy, $C_{6-10}$ aryl, $C_{6-10}$ aryloxy, $C_{7-10}$ alkylaryl, $C_{7-10}$ alkylaryloxy, or a combination of at least two of the foregoing.

In some embodiments, the acid-deprotectable monomer comprises at least two acid-deprotectable groups in addition to the acrylate ester $(CH_2=C(R^a)-C(=O)-O-C(R^x)(R^y)((CH_2)_cR^z))$. Examples of acid-deprotectable groups include In some embodiments, the acid-deprotectable monomer is an acrylate (CH$_2$=CH—C(=O)—O—) or methacrylate (CH$_2$=C(CH$_3$)—C(=O)—O—) ester comprising one of the R$^z$ groups of the preceding paragraph.
Specific examples of the acid-deprotectable monomer include
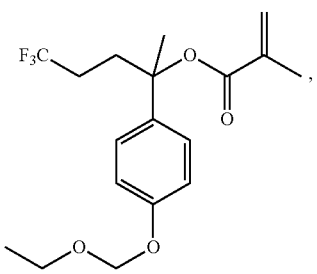
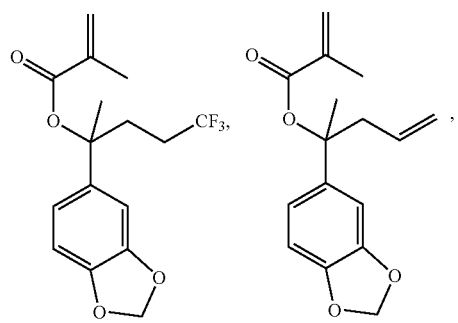
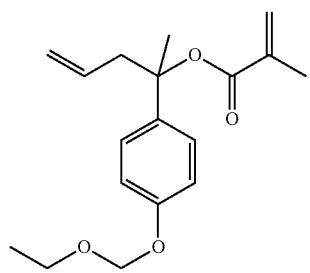
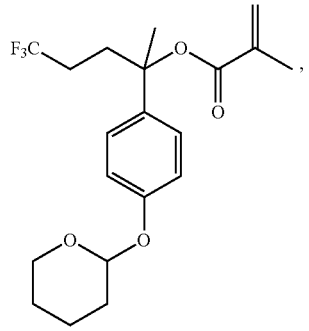
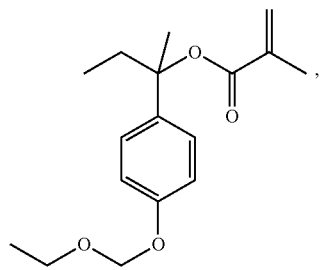
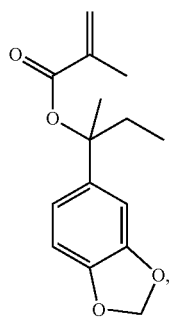
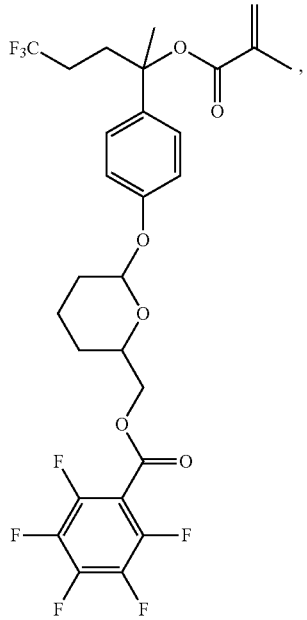
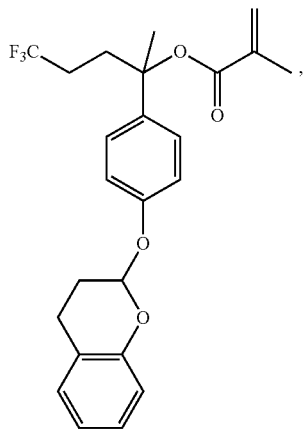

11
-continued
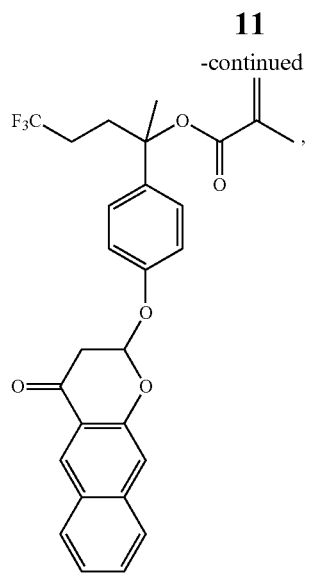
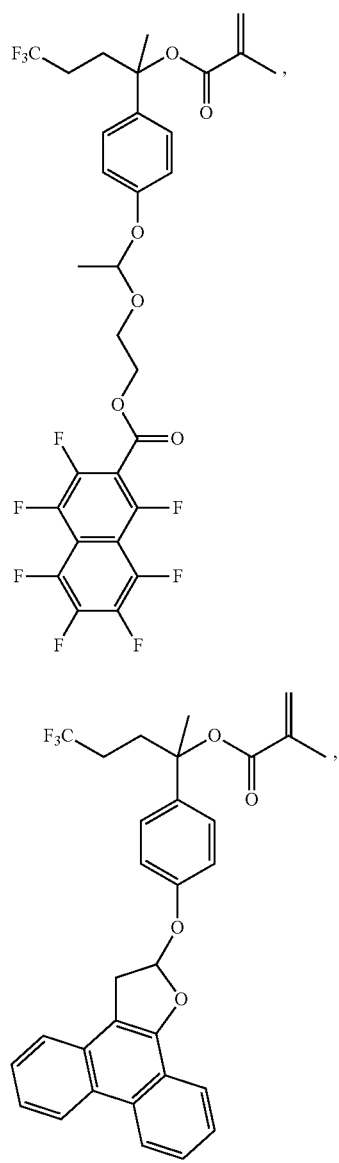
12
-continued
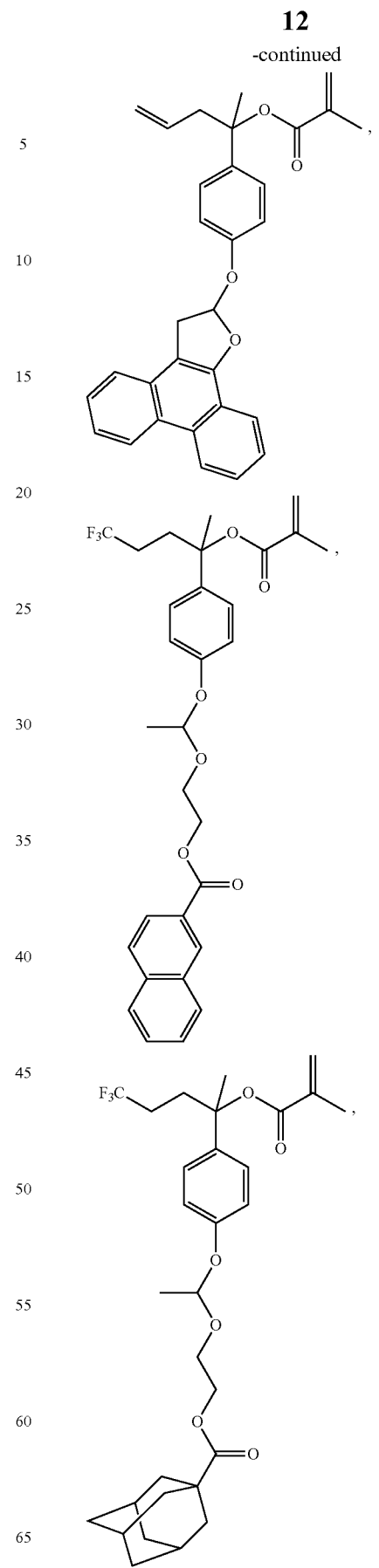

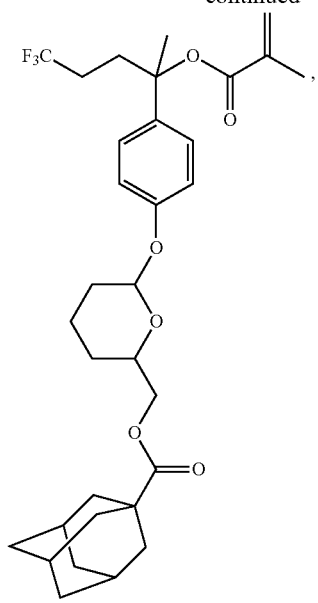
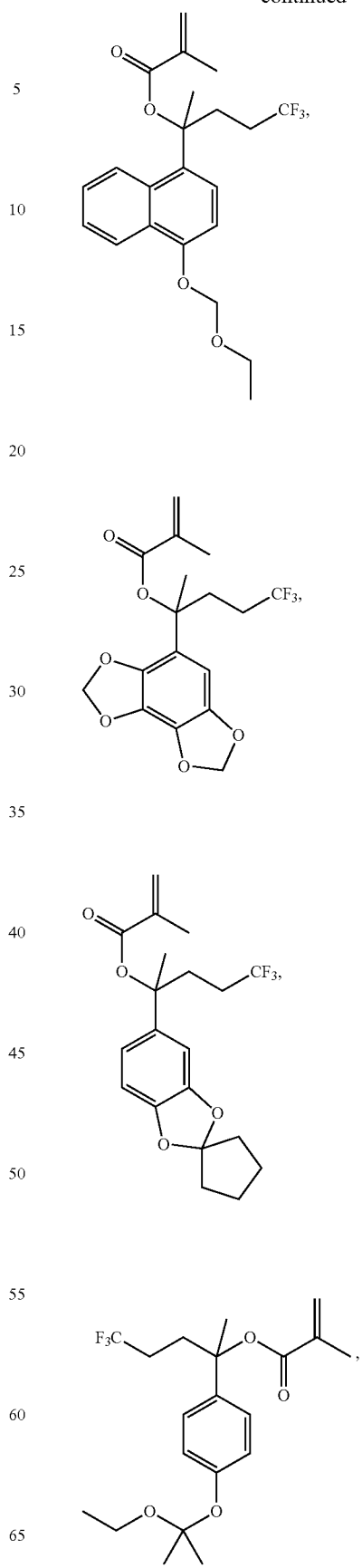

-continued
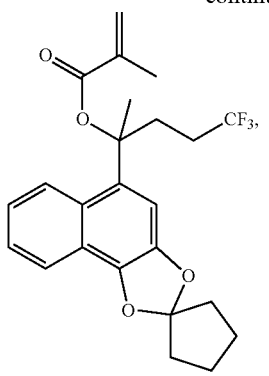
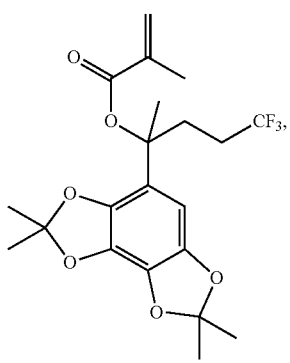
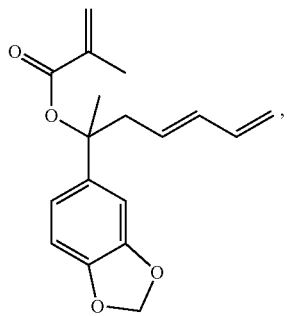
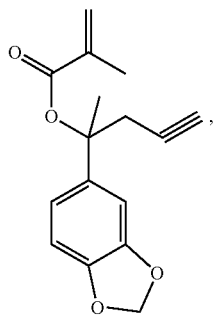
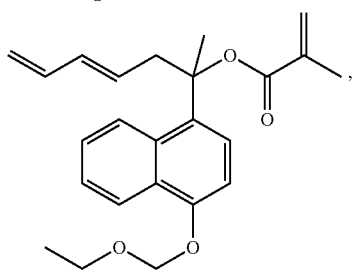
-continued
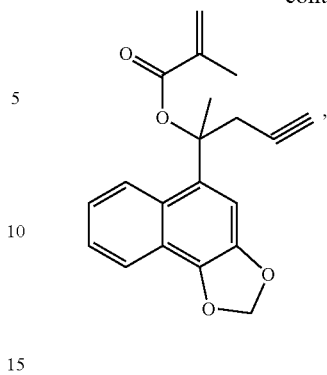
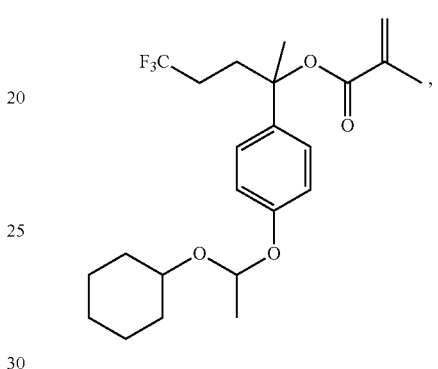
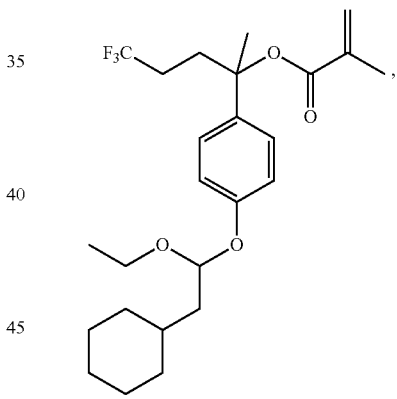
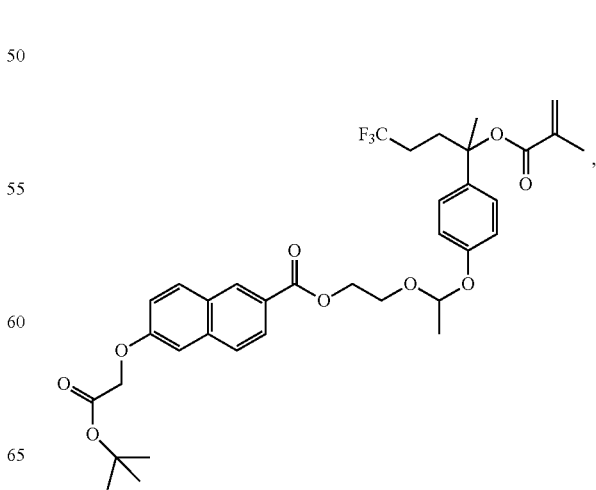

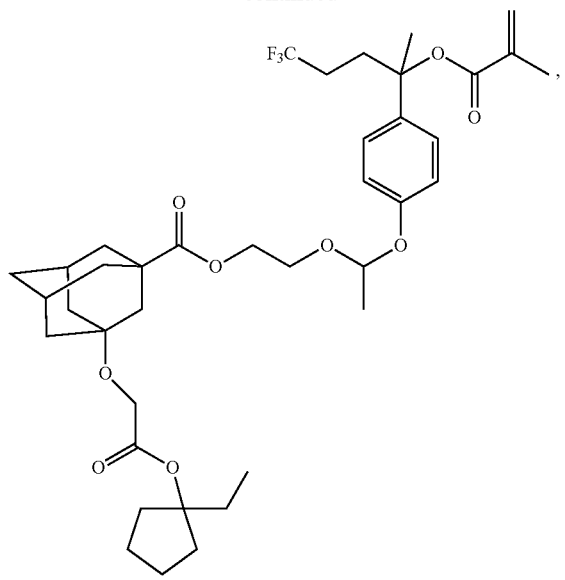

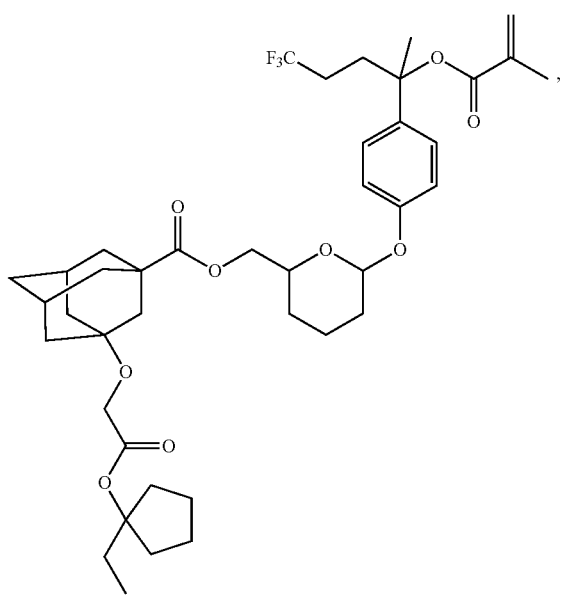

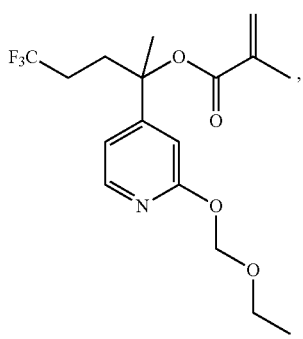

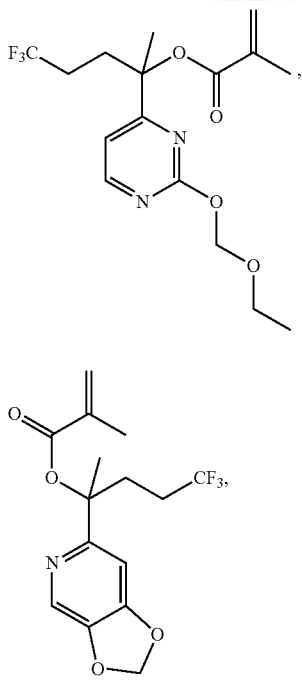

or a combination of at least two of the foregoing.

In a very specific embodiment, the acid-deprotectable monomer is

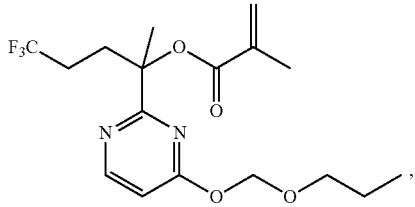

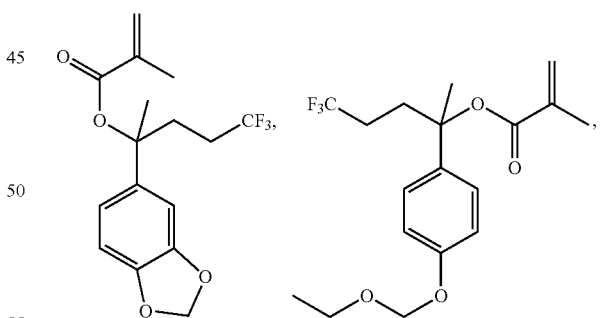

or a combination thereof.

The copolymer comprising the polymerized product of the acid-deprotectable monomer and a comonomer. In some embodiments, the comonomer used to form the copolymer comprises at least one of the following monomers: an acid-deprotectable monomer having the formula (II), a lactone-containing monomer of the formula (III), a base-soluble monomer of formula (IV), a photoacid-generating monomer of the formula (V), or a combination of at least two of the foregoing monomers,

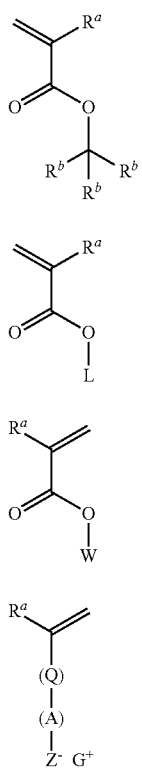

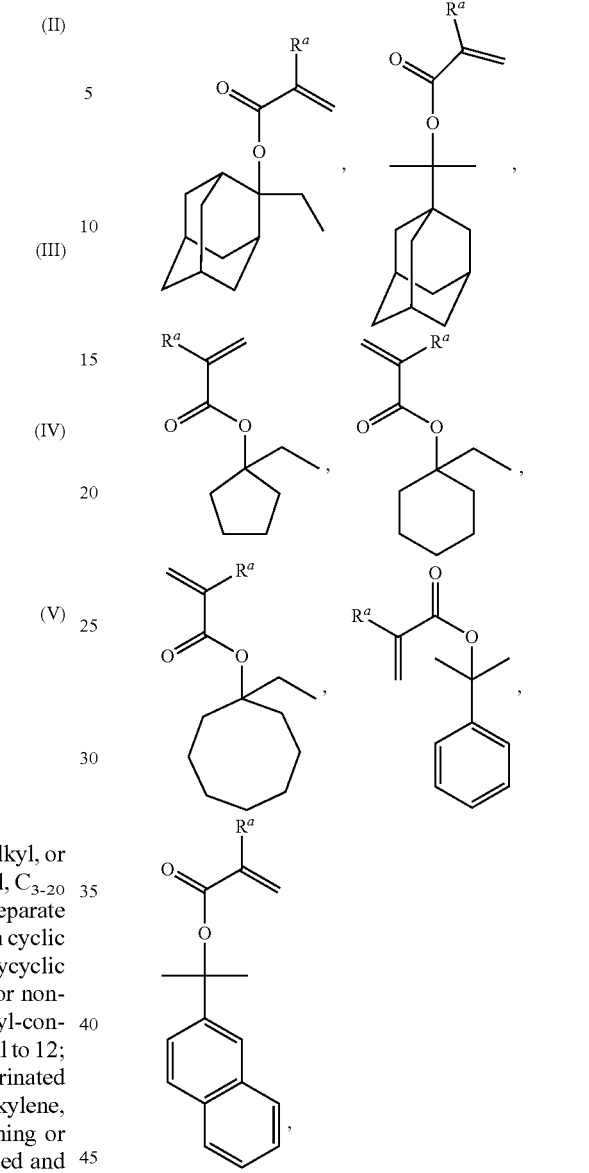

wherein each $R^a$ is independently H, F, —CN, $C_{1-10}$ alkyl, or $C_{1-10}$ fluoroalkyl; each $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure; L is a monocyclic, polycyclic, or fused polycyclic $C_{4-20}$ lactone-containing group; W is a halogenated or non-halogenated, aromatic or non-aromatic $C_{2-50}$ hydroxyl-containing organic group having a $pK_a$ of less than or equal to 12; Q is ester-containing or non-ester-containing and fluorinated or non-fluorinated and is $C_{1-20}$ alkylene, $C_{3-20}$ cycloalkylene, $C_{6-20}$ arylene, or $C_{7-20}$ aralkylene; A is ester-containing or non-ester-containing and fluorinated or non-fluorinated and is $C_{1-20}$ alkylene, $C_{3-20}$ cycloalkylene, $C_{6-20}$ arylene, or $C_{7-20}$ aralkylene; $Z^-$ is an anionic moiety comprising sulfonate, or an anion of a sulfonimide, and $G^+$ is a sulfonium or iodonium cation.

The acid deprotectable monomer is any acid-deprotectable monomer not within the scope of the acid-deprotectable monomer. Examples of such acid-deprotectable monomers include

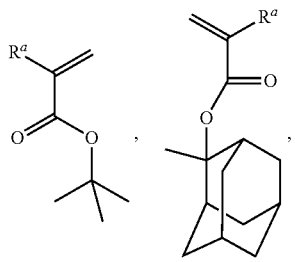

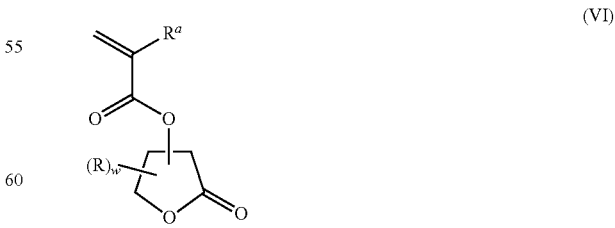

or a combination of at least two of the foregoing, wherein $R^a$ is H, F, —CN, $C_{1-10}$ alkyl, or $C_{1-10}$ fluoroalkyl.

In some embodiments, the lactone-containing monomer has the formula (VI)

wherein $R^a$ is H, F, —CN, $C_{1-10}$ alkyl, or $C_{1-10}$ fluoroalkyl; R is a $C_{1-10}$ alkyl, cycloalkyl, or heterocycloalkyl, and w is 0, 1, 2, 3, 4, or 5. In formula (VI), R is attached directly to the lactone ring or commonly attached to the lactone ring and/or one or more other R groups, and the ester moiety is attached to the lactone ring directly, or indirectly through R.

Examples of lactone-containing monomers include

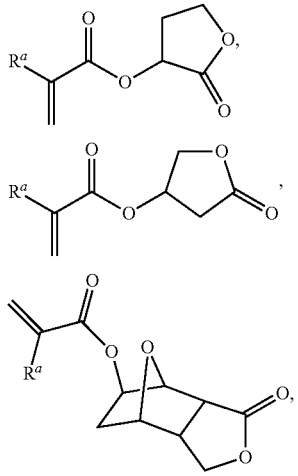

and combinations of at least two of the foregoing, wherein $R^a$ is H, F, —CN, $C_{1-10}$ alkyl, or $C_{1-10}$ fluoroalkyl.

In some embodiments, the base-soluble monomer has the formula (VII)

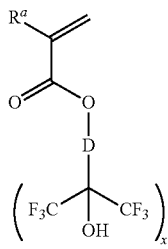

(VII)

wherein $R^a$ is H, F, —CN, $C_{1-10}$ alkyl, or $C_{1-10}$ fluoroalkyl; D is a hydroxyl-containing or non-hydroxyl containing, ester-containing or non-ester-containing, fluorinated or non-fluorinated $C_{1-20}$ alkylene, $C_{3-20}$ cycloalkylene, $C_{6-20}$ arylene, or $C_{7-20}$ aralkylene, or D is hydroxyl-containing $C_{6-20}$ aryl; and x is an integer of from 0 to 4, wherein when x is 0, D is a hydroxyl-containing $C_{6-20}$ aryl.

Examples of base-soluble monomers include

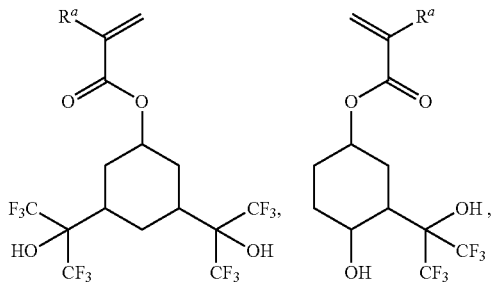

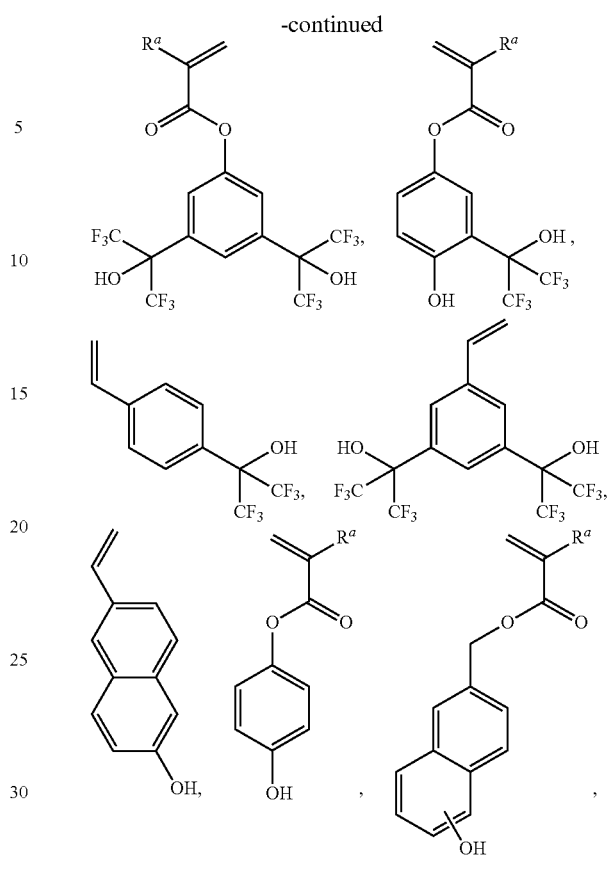

and combinations of at least two of the foregoing, wherein $R^a$ is H, F, —CN, $C_{1-10}$ alkyl, or $C_{1-10}$ fluoroalkyl.

In some embodiments, the photoacid-generating monomer has the structure (VIII) or (IX)

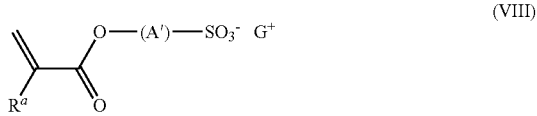

(VIII)

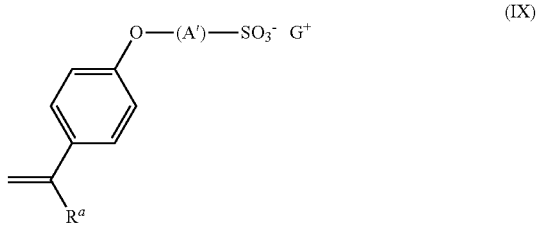

(IX)

wherein each $R^a$ is independently H, F, —CN, $C_{1-10}$ alkyl, or $C_{1-10}$ fluoroalkyl; A' is a fluorine-substituted $C_{1-20}$ alkylene group, a fluorine-substituted $C_{3-20}$ cycloalkylene group, a fluorine-substituted $C_{6-20}$ arylene group, or a fluorine-substituted $C_{7-20}$ aralkylene group; and $G^+$ is a sulfonium or iodonium cation. In some embodiments, in formulas (VIII) and (IX), A' is a —[C(R$^1$)$_2$)$_q$C(=O)O]$_b$—(C(R$^2$)$_2$)$_y$(CF$_2$)$_z$— group, or an o-, m- or p-substituted —C$_6$F$_4$— group, where each R$^1$ and R$^2$ is independently H, F, —CN, $C_{1-10}$ alkyl, or $C_{1-10}$ fluoroalkyl; b is 0 or 1; and q and y and z are each independently 0, 1, 2, 3, 4, 5, 6, 7, 8, 9, or 10, provided that the sum of y and z is at least 1.

Examples of photoacid-generating monomers include

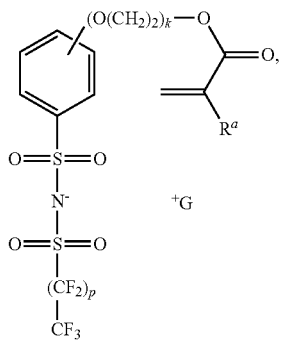

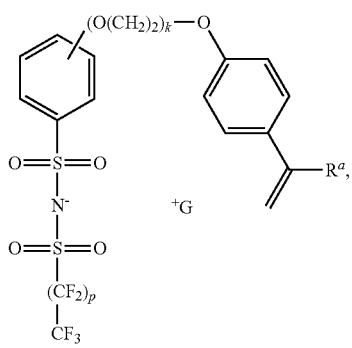

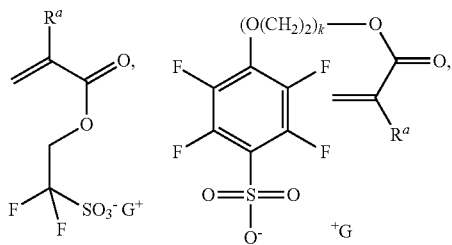

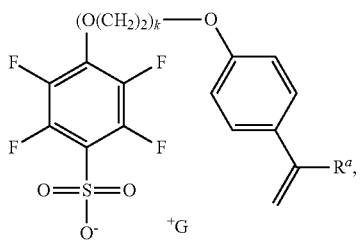

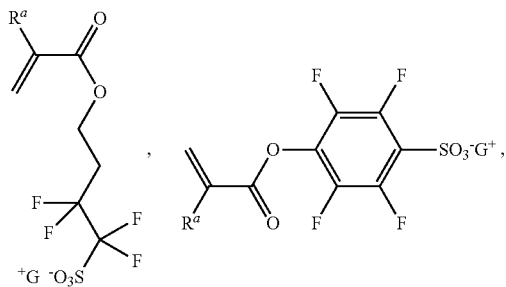

-continued

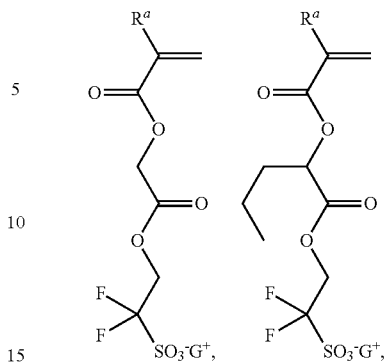

and combinations of at least two of the foregoing, where each $R^a$ is independently H, F, —CN, $C_{1-10}$ alkyl, or $C_{1-10}$ fluoroalkyl; $G^+$ is a sulfonium or iodonium cation; k is 0, 1, 2, 3, or 4; and p is 0, 1, 2, 3, 4, 5, 6, or 7.

The photoacid-generating monomer includes a sulfonium or iodonium cation, $G^+$. In some embodiments, the sulfonium or iodonium cation has the formula (X),

wherein X is S or I, wherein when X is I then a is 2, and when X is S then a is 3; each occurrence of $R^0$ is independently an unsubstituted or substituted $C_{1-30}$ alkyl group, an unsubstituted or substituted polycyclic or monocyclic $C_{3-30}$ cycloalkyl group, an unsubstituted or substituted polycyclic or monocyclic $C_{4-30}$ aryl group, or a combination of at least two of the foregoing, wherein one of the $R^0$ groups can optionally be attached to an adjacent $R^0$ group by a single bond.

Additional examples of photoacid-generating monomers include

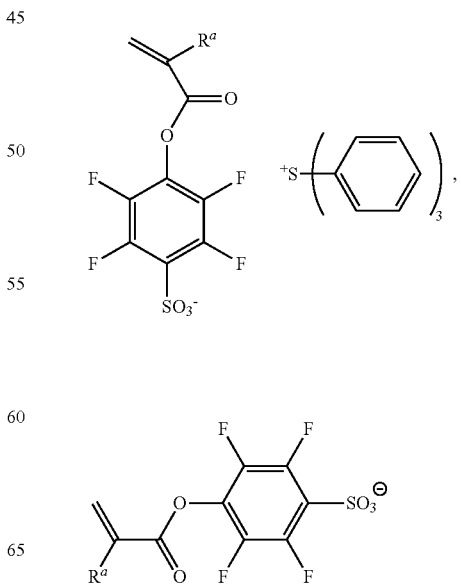

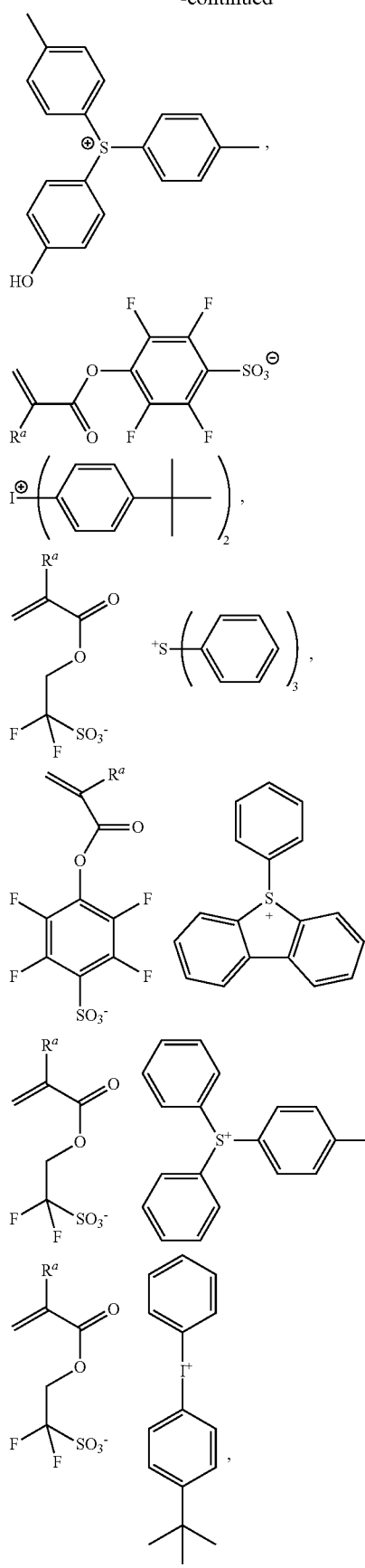
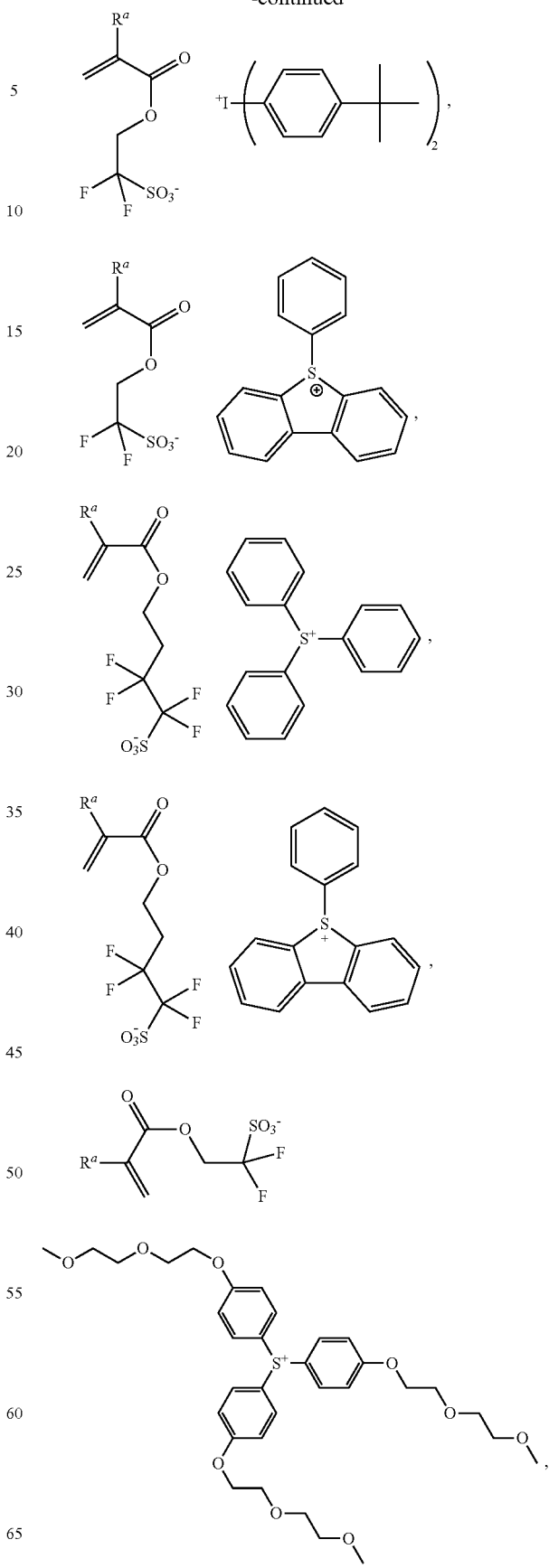

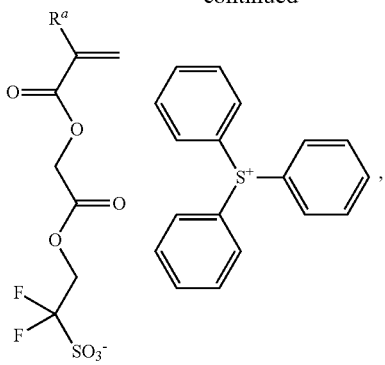

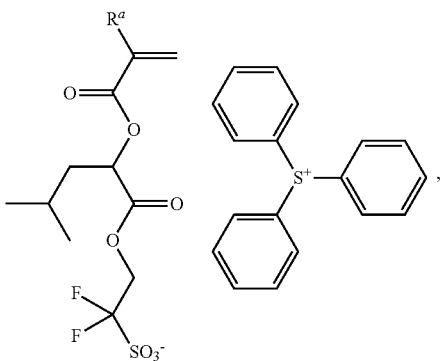

and combinations of at least two of the foregoing, where each $R^a$ is independently H, F, —CN, $C_{1-10}$ alkyl, or $C_{1-10}$ fluoroalkyl.

The copolymer is used to prepare a photoresist. The photoresist can optionally include one or more photoacid-generating (PAG) compounds separate from any photoacid-generating functionality in the copolymer; an additional polymer; and additives such as a photo-destroyable base, a surfactant, a dissolution rate inhibitor, a sensitizer. The photoresist components are dissolved in solvent for dispensing and coating.

The photoresist can include a photo-destroyable base. Inclusion of base materials, preferably the carboxylate salts of photo-decomposable cations, provides a mechanism for neutralization of acid from the acid decomposable groups and limits the diffusion of the photogenerated acid, thereby providing improved contrast in the photoresist.

Photo-destroyable bases include photo-decomposable cations, and preferably those also useful for preparing PAGs, paired with an anion of an organic acid such as, for example, a $C_{1-20}$ carboxylic or sulfonic acid. Examples of such carboxylic acids include formic acid, acetic acid, propionic acid, tartaric acid, succinic acid, cyclohexylcarboxylic acid, benzoic acid, and salicylic acid. Examples of sulfonic acids include methansulfonic acid, toluenesulfonic acid, cyclohexanesulfonic acid, and camphorsulfonic acid. Photo-destroyable bases include cation/anion pairs of the following structures, wherein the cation is triphenylsulfonium or one of the following

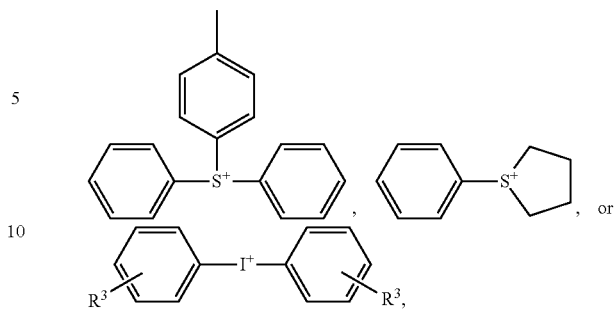

where $R^3$ is independently H, a $C_{1-20}$ alkyl, a $C_{6-20}$ aryl, or a $C_{7-20}$ alkylaryl; and the anion is

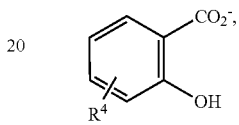

$R^4C(=O)$—$O^-$, or $R^4S(=O)_2$—$O^-$, wherein $R^4$ is H, a $C_{1-20}$ alkyl, a $C_{1-20}$ alkoxy, a $C_{3-20}$ cycloalkyl, a $C_{3-20}$ cycloalkoxy, a $C_{6-20}$ aryl, or a $C_{6-20}$ alkylaryl. Other photo-destroyable bases include those based on non-ionic photo-decomposing chromophores such as, for example, 2-nitrobenzyl groups and benzoin groups. An exemplary photobase generator is ortho-nitrobenzyl carbamate.

Alternatively, or in addition, the photoresist can include quenchers that are non-photo-destroyable bases, such as, for example, those based on hydroxides, carboxylates, amines, imines, and amides. In some embodiments, such quenchers include $C_{1-30}$ amines, $C_{1-30}$ imines, $C_{1-30}$ amides, $C_{1-30}$ quaternary ammonium salts of a strong base (e.g., a hydroxide or alkoxide) or a weak base (e.g., a carboxylate). Examples of quenchers include amines such as Troger's base, hindered amines such as diazabicycloundecene (DBU) and diazabicyclononene (DBN), and ionic quenchers including quaternary alkyl ammonium salts such as tetrabutylammonium hydroxide (TBAH) and tetrabutyl ammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent suitable for dissolving, dispensing, and coating the photoresist on a substrate. Examples of solvents include aromatic solvents such as anisole; alcohols such as 1-methoxy-2-propanol, and 1-ethoxy-2 propanol; esters such as ethyl lactate, n-butyl acetate, 1-methoxy-2-propyl acetate, methoxyethyl propionate, ethoxyethyl propionate, and methyl 2-hydroxyisobutyrate; ketones such as cyclohexanone and 2-heptanone; and combinations of at least two of the foregoing solvents.

The photoresist composition can include the copolymer in an amount of 50 to 99 weight percent, specifically 55 to 95 weight percent, more specifically 60 to 90 weight percent, and still more specifically 65 to 90 weight percent, based on the total weight of solids in the photoresist composition. It will be understood that "copolymer" used in this context of a component in a photoresist may mean only the copolymer disclosed herein, or a combination of the copolymer with another polymer useful in a photoresist. The one or more photoacid-generating (PAG) compounds can be present in an amount of 5 to 40 weight percent, specifically 15 to 25 weight percent, based on the total weight of solids in the photoresist composition. The photo-destroyable base can be present in the photoresist in an amount of 0.01 to 5 weight percent, specifically 0.1 to 4 weight percent, and still more specifically 0.2 to 3 weight percent, based on the total weight of solids in the photoresist composition. A surfactant can be included in an amount of 0.01 to 5 weight percent, specifically 0.1 to 4 weight percent, and still more specifically 0.2 to 3 weight percent, based on the total weight of solids in the photoresist composition. A quencher can be included in relatively small amounts of for example, 0.03 to 5 weight percent, based on the total weight of solids in the photoresist composition. Other additives can be included in amounts of less than or equal to 30 weight percent, specifically less than or equal to 20 weight percent, or more specifically less than or equal to 10 weight percent, based on the total weight of solids in the photoresist composition. The total solids content of the photoresist composition can be 0.5 to 50 weight percent, specifically 1 to 45 weight percent, more specifically 2 to 40 weight percent, and still more specifically 5 to 35 weight percent, based on the total weight of solids and solvent. It will be understood that the solids include copolymer, photo-destroyable base, quencher, surfactant, any added PAG, and any optional additives, exclusive of solvent.

A coated substrate can be formed from the photoresist. Such a coated substrate includes: (a) a substrate typically having one or more layers to be patterned on a surface thereof; and (b) a layer of the photoresist composition over the one or more layers to be patterned.

The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, having one or more layers and patterned features formed on a surface thereof. Optionally, the underlying base substrate material itself may be patterned, for example, when it is desired to form trenches in the base substrate material. Layers formed over the base substrate material may include, for example, one or more conductive layers such as layers of aluminum, copper, molybdenum, tantalum, titanium, tungsten, and alloys, nitrides or silicides of such metals, doped amorphous silicon or doped polysilicon, one or more dielectric layers such as layers of silicon oxide, silicon nitride, silicon oxynitride or metal oxides, semiconductor layers, such as single-crystal silicon, underlayers, antireflective layers such as a bottom antireflective layers, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating or spin-coating.

Further, a method of forming an electronic device includes (a) applying a layer of a photoresist composition including on a surface of the substrate; (b) patternwise exposing the photoresist composition layer to activating radiation; and (c) developing the exposed photoresist composition layer to provide a resist relief image. In some embodiments, the method further comprises (d) etching the resist relief pattern into the underlying substrate.

Applying the photoresist composition to the substrate can be accomplished by any suitable method, including spin coating, spray coating, dip coating, and doctor blading. In some embodiments, applying the layer of photoresist composition is accomplished by spin coating the photoresist in solvent using a coating track, in which the photoresist composition is dispensed on a spinning wafer. During dispensing, the wafer can be spun at a speed of up to 4,000 rotations per minute (rpm), specifically 500 to 3,000 rpm, and more specifically 1,000 to 2,500 rpm. The coated wafer is spun to remove solvent, and baked on a hot plate to remove residual solvent and free volume from the film to make it uniformly dense.

Patternwise exposure is then carried out using an exposure tool such as a stepper, in which the film is irradiated through a pattern mask and thereby is exposed patternwise. In some embodiments, the method uses advanced exposure tools generating activating radiation at wavelengths capable of high resolution including extreme-ultraviolet (EUV) or electron-beam (e-beam) radiation. It will be appreciated that exposure using the activating radiation decomposes the PAG in the exposed areas and generates acid and decomposition by-products, and that the acid then effects a chemical change in the polymer (deblocking the acid sensitive groups to generate a base-soluble group, or alternatively, catalyzing a cross-linking reaction in the exposed areas). The resolution of such exposure tools can be less than 30 nanometers.

Developing the exposed photoresist layer is then accomplished by treating the exposed layer with a suitable developer capable of selectively removing the exposed portions of the film (where the photoresist is positive tone) or removing the unexposed portions of the film (where the photoresist is crosslinkable in the exposed regions, i.e., negative tone). In some embodiments, the photoresist is positive tone based on a polymer having acid-sensitive (deprotectable) groups, and the developer is preferably a metal-ion-free tetraalkylammonium hydroxide solution, such as, for example, aqueous 0.26 Normal tetramethylammonium hydroxide. Alternatively, negative tone development (NTD) can be conducted by use of a suitable organic solvent developer. NTD results in the removal of unexposed regions of the photoresist layer, leaving behind exposed regions due to polarity reversal of those regions. Suitable NTD developers include, for example, ketones, esters, ethers, hydrocarbons, and mixtures thereof. Other suitable solvents include those used in the photoresist composition. In some embodiments, the developer is 2-heptanone or a butyl acetate such as n-butyl acetate. Whether the development is positive tone or negative tone, a pattern forms by developing.

The photoresist can, when used in one or more such a pattern-forming processes, be used to fabricate electronic and optoelectronic devices such as memory devices, processor chips (including central processing units or CPUs), graphics chips, and other such devices.

The invention is further illustrated by the following examples.

EXAMPLES

All compounds and reagents used herein are available commercially except where a procedure is provided below.

Structural characterization was carried out by nuclear magnetic resonance (NMR) spectrometry on an INOVA 500 NMR Spectrometer with OMNI-PROBE (operating at 500 MHz for proton) or GEMINI 300 NMR Spectrometer (operating at 282 MHz for fluorine), each from Varian. Polymer composition was determined by quantitative $^{13}$C NMR at 125 MHz using NOE suppression techniques (i.e., Cr(acetylacetonate)$_3$ and a pulse delay of >5 seconds). Number average molecular weight ($M_n$), weight average molecular weight ($M_w$) and dispersity ($M_w/M_n$) were determined by gel permeation chromatography (GPC) using a sample concentration of 1 milligram/milliliter and a crosslinked styrene-divinylbenzene column with universal calibration curve calibrated with polystyrene standards, and eluted with tetrahydrofuran at a flow rate of 1 milliliter/minute.

Monomer (Ia) was synthesized according to Scheme 1. The corresponding tertiary alcohol was synthesized by treating 1-(benzo[d][1,3]dioxol-5-yl)ethanone with (3,3,3-trifluoropropyl)magnesium bromide followed by methacroyl chloride, affording the desired monomer in 50-60% overall yield.

Scheme 1

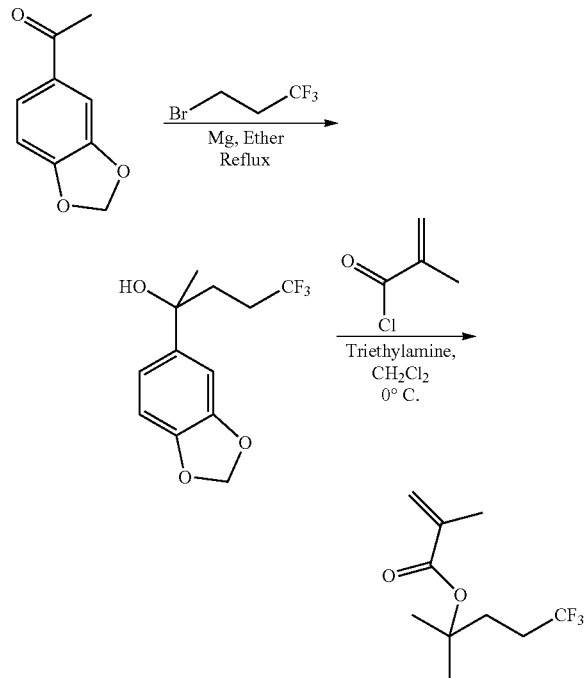

In a 500 milliliter, three-necked oven-dried round bottom flask equipped with a magnetic stirrer and charged with 200 milliliters of 0.50 M (3,3,3-trifluoropropyl)magnesium bromide in tetrahydrofuran was added 16.4 grams (0.1 mole) of 1-(benzo[d][1,3]dioxol-5-yl)ethanone, and the mixture was stirred at room temperature for 4 hours. The reaction was quenched by slowly pouring the mixture into 400 milliliters saturated ammonium chloride solution and extracted into 400 milliliters of ethyl acetate, and washed with brine then water to a neutral pH. The ethyl acetate extracts were then dried over sodium sulfate, filtered and concentrated in the rotary evaporator affording 17.28 grams of 2-(benzo[d][1,3]dioxol-5-yl)propan-2-ol (~96% yield) as an amber oil which was used without further purification. 17 grams (0.096 mole) 2-(benzo[d][1,3]dioxol-5-yl)propan-2-ol and 11.6 grams (0.11 mole) of triethylamine were dissolved in 40 milliliters of methylene chloride and the resulting solution was slowly added to a flask equipped with magnetic stirrer and containing 11 milliliters (0.105 mole) of methacroyl chloride in 100 milliliters of dichloromethane cooled, which had been cooled to 0° C. The resultant mixture was slowly warmed to room temperature and allowed to stir for 12 hours. Upon completion of the reaction, confirmed by thin layer chromatography (TLC), the mixture was quenched by pouring it into 400 milliliters of deionized water, then extracting the product into methylene chloride. The methylene chloride extracts were then dried over sodium sulfate, filtered, and concentrated in the rotary evaporator affording 22.8 grams (~72% yield) of 2-(benzo[d][1,3]dioxol-5-yl)-5,5,5-trifluoropentan-2-yl methacrylate as an amber oil. The oil was purified further by passing through a silica gel plug eluting with a 70/30 mixture of hexanes/methylene chloride affording 19 grams of the pure product. $^1$H NMR (500 MHz, Acetone-d$_6$): δ 6.89-6.81 (m, Ar, 3H), 6.23 (s, 1H), 5.97 (s, 2H), 5.92 (s, 1H), 2.48-2.1 (m/m, 4H), 1.914 (s, 3H), 1.89 (s, 3H).

Control monomer (XI), lacking an acetal group, was prepared according to the same general procedure as monomer (Ia).

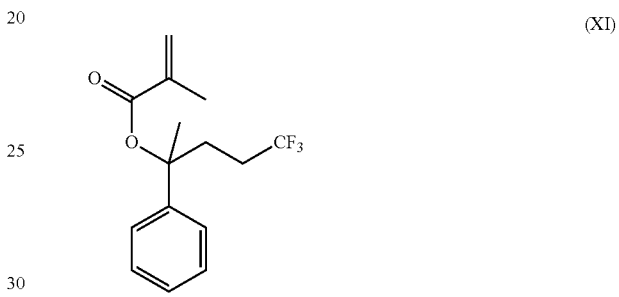

Monomer (Ib) was synthesized according to Scheme 2. The 4-hydroxyacetophenone was protected quantitatively with chloro methyl ethyl ether, followed by subsequent Grignard reaction to form the tertiary alcohol, and then acylation to the final methacrylate monomer.

Scheme 2

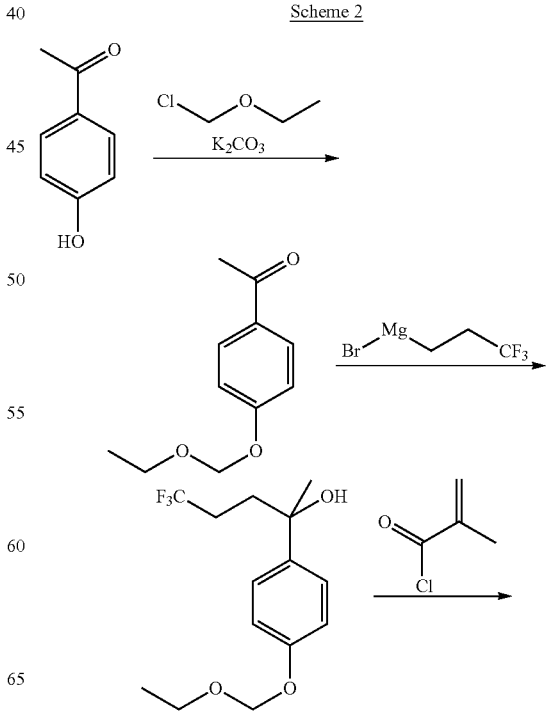

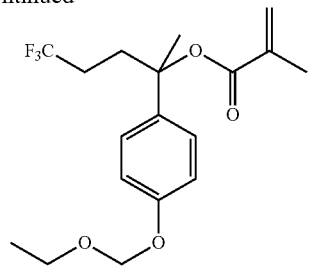

In a 300 milliliter, three-necked oven-dried round bottom flask equipped with a magnetic stirrer, 25 grams (0.18 mole) of 1-(4-hydroxyphenyl)ethanone and 38.6 grams (0.27 mole) of potassium carbonate ($K_2CO_3$) were suspended in 200 milliliters of acetone and the mixture was stirred at room temperature for 1 hour, forming a thick slurry. 18.6 grams (0.198 mole) of (chloromethoxy)ethane was slowly added to the reaction mixture using a dropping funnel over a period of one hour and the reaction refluxed overnight for another 12 hours until completion was ascertained by TLC analysis (1:99 methanol/chloroform). The reaction was quenched by pouring the mixture slowly into 400 milliliters of 0.01% hydrochloric acid (HCl) solution, and the product was extracted into 300 milliliters of ethyl acetate, and washed with brine then water to a neutral pH. The ethyl acetate extracts were then dried over sodium sulfate, filtered, and concentrated on a rotary evaporator affording 34.58 grams (~99% yield) of 1-(4-(ethoxymethoxy)phenyl)ethanone as an oil. The product was used without further purification. $^1$H NMR (500 MHz, Acetone-$d_6$): δ 7.94-7.91 (d, 2H, 8.5 Hz), 7.13-7.07 (d, 2H, 8 Hz), 5.31 (s, 2H), 3.702-3.67 (q, 2H), 2.49 (s, 3H), 1.16-1.11 (t, 3H).

In a 500 milliliter, three-necked oven-dried round bottom flask equipped with a magnetic stirrer and charged with 200 milliliters of 0.50 M (3,3,3-trifluoropropyl)magnesium bromide in tetrahydrofuran was added 19.4 grams (0.1 mole) of 1-(4-(ethoxymethoxy)phenyl)ethanone and the mixture was stirred at room temperature for 4 hours. The reaction was quenched by slowly pouring the mixture into 400 milliliters saturated ammonium chloride solution and extracting the product into 400 milliliters of ethyl acetate, and washing with brine then water to a neutral pH. The ethyl acetate extracts were then dried over sodium sulfate, filtered, and concentrated in the rotary evaporator affording 20.17 grams (~96% yield) of 2-(4-(ethoxymethoxy)phenyl)propan-2-ol as an amber oil which was used without further purification. 20 grams (0.096 mole) 2-(4-(ethoxymethoxy)phenyl)propan-2-ol and 11.6 grams (0.11 mole) of triethylamine were dissolved in 40 milliliters of methylene chloride and slowly added to a flask equipped with magnetic stirrer and 11 milliliters (0.105 mole) of methacroyl chloride in 100 milliliters of dichloromethane, which had been cooled to 0° C. The resultant mixture was slowly warmed to room temperature and allowed to stir for 12 hours. Upon completion of the reaction, confirmed by thin layer chromatography, the mixture was quenched by pouring into 400 milliliters of deionized water and the product was extracted into methylene chloride. The methylene chloride extracts were then dried over sodium sulfate, filtered, and concentrated in the rotary evaporator affording 29.3 grams (~85% yield) of 2-(4-(ethoxymethoxy) phenyl)-5,5,5-trifluoropentan-2-yl methacrylate as an amber oil. The oil was purified further by passing through a silica gel plug eluting with 70/30 hexanes/methylene chloride affording 19 grams of the pure product. $^1$H NMR (500 MHz, Acetone): δ 7.29-7.26 (d, 2H, 8.5 Hz), 6.98-6.95 (d, 2H, 8 Hz), 6.06 (s, 1H), 5.57 (s, 1H) 5.20 (s, 2H) 3.69-3.66 (q, 2H), 2.48-2.1 (m/m, 4H), 1.884 (s, 3H), 1.80 (s, 3H), 1.17-1.12 (t, 3H).

The activation energy ($E_a$) for acid deprotection of monomers (Ia), (Ib), and (X) was determined using proton nuclear magnetic resonance spectroscopy ($^1$H NMR) by dissolving the various monomers in dimethyl sulfoxide (DMSO). Each mixture was stirred to form a clear, colorless solution, loaded into a 5 millimeter NMR tube, and stored in a −40° C. freezer until use. The leaving group deprotection rate was monitored at 60, 70, and 80° C. by adding an equimolar amount of methanesulfonic acid to the monomer solution. The probe of a Varian 500-MR NMR spectrometer was set to the desired temperature, the methanesulfonic acid was added to the monomer solution in the NMR tube, and the sample loaded into the spectrometer. The rate constant (k) for ester hydrolysis was determined by monitoring the concentration of monomer versus time at the different temperatures listed and fitting the data to a second-order kinetic model (first-order in monomer and first-order in methanesulfonic acid). The rate constants at the three temperatures were then used to determine the activation energy (Ea) via the Arrhenius equation, $$k=Ae^{-Ea/(RT)}$$

wherein k is the rate constant, A is the pre-exponential factor, Ea is the activation energy, R is the gas constant, and T is the temperature in degrees kelvin. Linear regression of a plot of ln(k) on the y-axis versus 1/T on the x-axis yields a line with slope −Ea/R and y-intercept ln(A). Activation energy values, expressed in units of kilojoules per mole, are summarized in Table 1.

TABLE 1

| Monomer | $E_a$ (kJ/mol) |
|---|---|
| (Ia) | 18.7 |
| (Ib) | 16.2 |
| (X) | 27.9 |

The three monomers were used to synthesize three copolymers using a previously published semi-batch method. V Jain, S. M. Coley, J. J. Lee, M. D. Christianson, D. J. Arriola, P. LaBeaume, M. E. Danis, N. Ortiz, S. J. Kang, M. D. Wagner, A. Kwok, D. A. Valeri, J. W. Thackeray, "Impact of polymerization process on OOB on lithographic performance of a EUV resist", *Proc. SPIE* 7969, Extreme Ultraviolet (EUV) Lithography II, 796912 (Apr. 6, 2011).

A representative copolymer preparation is as follows. Three separate solutions for heel, feed, and initiator were made. The heel solution was prepared by dissolving 2.57 grams 5,5,5-trifluoro-2-phenylpentan-2-yl methacrylate, 1.68 grams (0.009 mole) alpha-gammabutyrolactone methacrylate (α-GBLMA; also known as 2-oxotetrahydrofuran-3-yl methacrylate), 2.84 grams dihydroxyhexafluoroalcohol methacrylate (DiHFA; also known as 3,5-bis(1,1,1,3,3,3-hexafluoro-2-hydroxypropan-2-yl)cyclohexyl methacrylate), 1.63 grams 5-phenyl-5H-dibenzo[b,d]thiophenium-1,1-difluoro-2-(methacryloyloxy)ethanesulfonate (PDBT-$F_2$) in 66.58 gram ethyl lactate/gamma-butyrolactone (GBL) (70/30 v/v). The feed solution was prepared by dissolving 29.55 g 5,5,5-trifluoro-2-phenylpentan-2-yl methacrylate, 33.11 g α-GBLMA, 20.81 g DiHFA, 9.0 grams PDBT-$F_2$ 131 grams ethyl lactate/GBL (70/30 v/v). The initiator solution was prepared by dissolving 10.6 grams 2,2'-azobis-(2,4-dimethylvaleronitrile) in 22 grams acetonitrile/THF (1:2 v/v).

A 500 milliliter, three neck round bottom flask set up with a water condenser was charged with the heel solution and the contents were heated to 75° C. Once an equilibrium temperature was attained, the feed solution and initiator solution were fed into the reactor at a constant feed rate over four hours using two separate feed lines. The contents were stirred at 75° C. for additional 2 hours. Various aliquots were withdrawn from the reactor and were analyzed by GPC and high performance liquid chromatography (HPLC) for weight average molecular weight (Mw) determination and monomer consumption, respectively, through the course of reaction.

Once all the solution was fed into the reactor, 0.05 gram inhibitor (hydroquinone) was added to the reactor and the contents were cooled to room temperature. Precipitation was carried out in 10 volumes diisopropyl ether/methanol (95/5 v/v). The final polymer was dried in vacuum overnight. The yield of the dried polymer was about 60%, and GPC analysis showed a weight average molecular weight, $M_w$, of 6378 with a dispersity of 1.38.

The above polymers were then formulated and evaluated under KrF and EUV exposure conditions.

Photoresist preparation and processing. A positive-tone photoresist composition was prepared by combining 4.95 grams polymer prepared as above, 0.1 gram of a 5 weight percent solution of Omnova PolyFox™ 656 fluorosurfactant in ethyl lactate, 1.0 gram of a 1 weight percent solution of Troger's Base, 37.91 grams of hydroxymethyl isobutyrate (HBM) solvent, and 156 grams of ethyl lactate solvent.

The resist solution was passed through a 0.01 micrometer polytetrafluoroethylene filter. Resist formulations were spun cast on 200 millimeter Si wafers coated with 25 nanometers of underlayer to a resist thickness of 60 nanometers (AR™19, Rohm and Haas Electronic Materials LLC). The films were annealed at 130° C. for 90 seconds and exposed to EUV light source (NA=0.30; Quad; 0.22σ/0.68σ) using both an open frame array in order to obtain a contrast curve and through a binary mask containing dark field line/space patterns. The exposed wafers were baked at 100° C. for 60 seconds and then developed with 0.26 Normal tetramethylammonium hydroxide solution for 60 seconds.

Figure 2:
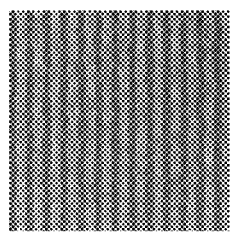
FIG. 2 is a line space image for the photoresist of Example 1.
Figure 3:
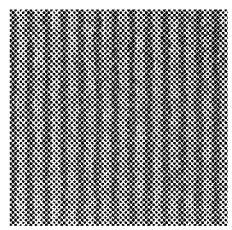
FIG. 3 is a line space image for the photoresist of Example 2.
Figure 4:
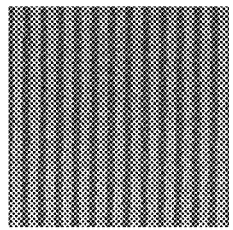
FIG. 4 is a line space image for the photoresist of the Comparative Example.

The exposed wafer was analyzed by the Hitachi 4800 CD-SEM (Critical Dimension Scanning Electron Microscopy) tool to quantify sensitivity and resolution. The exposure doses required to provide a 1:1 resolution at the top and bottom of a 26 nanometer line-and-space pattern (Esize at 26 nanometers L:S) are shown in Table 2 under the heading "Sensitivity @ 26 nm hp (mJ/cm$^2$)" (sensitivity at 26 nanometer half pitch, expressed in units of millijoules/centimeter$^2$). The exposure doses required to provide a 1:1 resolution at the top and bottom of the line-and-space patterns for Examples 1 and 2 were significantly less than those required for the Comparative Example. Line space images for Example 1, Example 2, and Example 3 were obtained at ESize values of 7.2 mJ/cm$^2$, 10.6 mJ/cm$^2$, and 20.9 mJ/cm$^2$, respectively, and are presented in FIGS. 2-4, respectively.

The dissolution kinetics of the copolymers are summarized in Table 2 and FIG. 1. The dissolution rates of the films were measured under different exposure doses at KrF by using a RDA-800EUV (LithoTech Japan). FIG. 1 shows an overlay of the dissolution rate curves of the different copolymers. Low Rmin is observed for resist with inhibiting protecting groups. Low activation energy leaving groups have a higher Rmax and higher Rmin. For Example 1, corresponding to monomer (Ia), the maximum dissolution rate was too high to be detected by this method, hence the "≥" associated with the Rmax value. High Rmax and Rmin normally are associated with smooth dissolution of resist in developer translating to improved line edge roughness.

TABLE 2

| | monomer | Sensitivity @ 26 nm hp (mJ/cm$^2$) | eMET EUV Eo (mJ/cm$^2$) | KrF Eo (mJ/cm$^2$) | Rmin | Rmax |
|---|---|---|---|---|---|---|
| Example 1 | (Ia) | 7.2 | 3.0 | 14.5 | 0.0152 | ≥1726 |
| Example 2 | (Ib) | 10.6 | 3.4 | 15 | 0.0123 | 3163 |
| Comparative Example | (X) | 20.9 | 6.0 | 45 | 0.0008 | 1316 |

The invention claimed is:

1. A copolymer comprising the polymerized product of:

an acid-deprotectable monomer having the formula (I) and a comonomer:

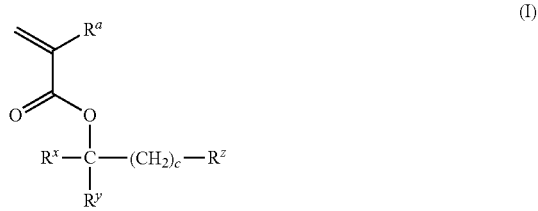

(I)

wherein c is 1, 2, 3, 4, or 5;

$R^a$ is H, F, —CN, $C_{1-10}$ alkyl, or $C_{1-10}$ fluoroalkyl;

$R^x$ is an unsubstituted or substituted $C_{1-10}$ linear or branched alkyl group, an unsubstituted or substituted $C_{3-10}$ cycloalkyl group, an unsubstituted or substituted $C_{3-10}$ alkenylalkyl group, or an unsubstituted or substituted $C_{3-10}$ alkynylalkyl group;

$R^y$ is fluorine-substituted $C_{3-6}$ linear alkyl, unsubstituted $C_{3-6}$ alkenylalkyl, or unsubstituted $C_{3-10}$ alkynylalkyl group; and $R^z$ is a $C_{6-20}$ aryl group substituted with an acetal-containing group or a ketal-containing group, or a $C_3$-$C_{20}$ heteroaryl group substituted with an acetal-containing group or a ketal-containing group, wherein the $C_{6-20}$ aryl group or the $C_3$-$C_{20}$ heteroaryl group can, optionally, be further substituted.

2. The copolymer of claim 1, wherein the acid-deprotectable monomer comprises at least two acid-deprotectable groups other than the acrylate ester.

3. The copolymer of claim 1, wherein $R^y$ is fluorine-substituted $C_{3-6}$ linear alkyl.

4. The copolymer of claim 1, wherein $R^z$ is
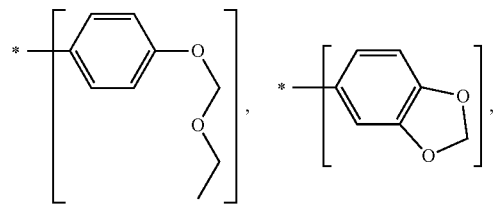, 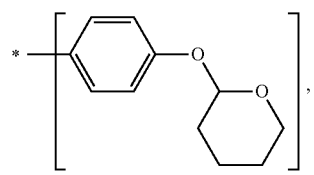,
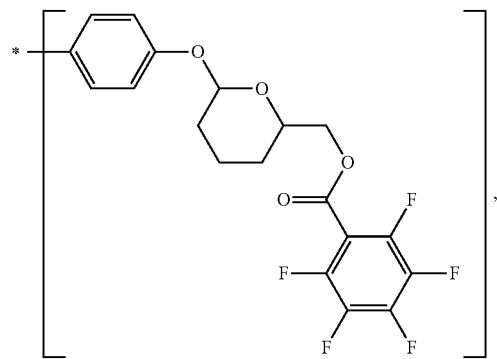
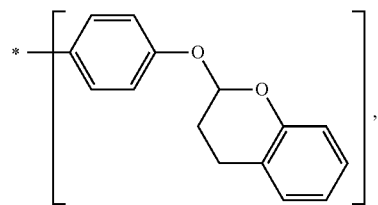,
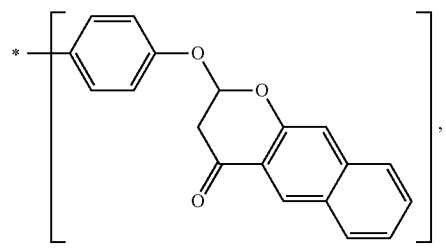,
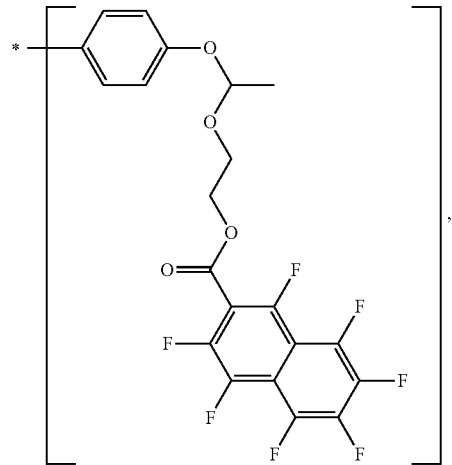,
-continued
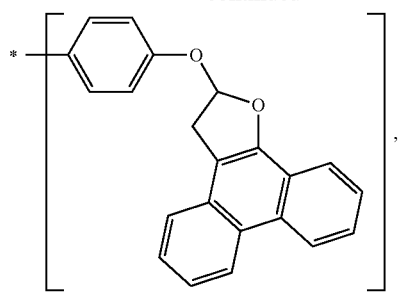,
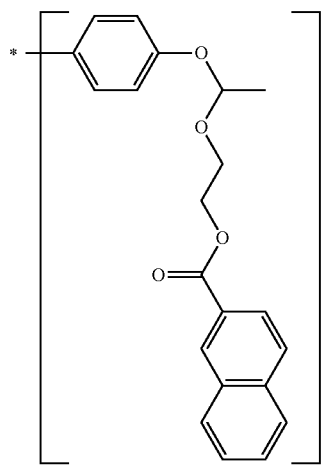,
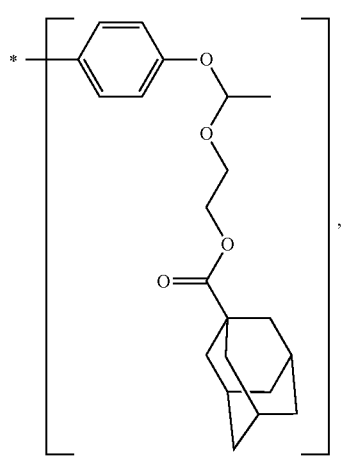,
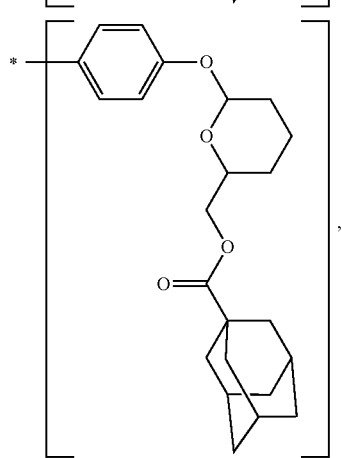, -continued
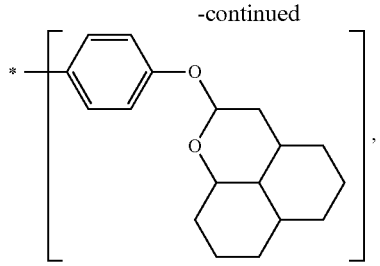,
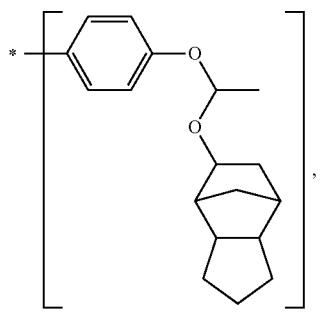,
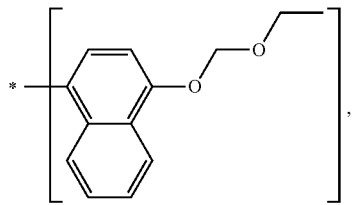,
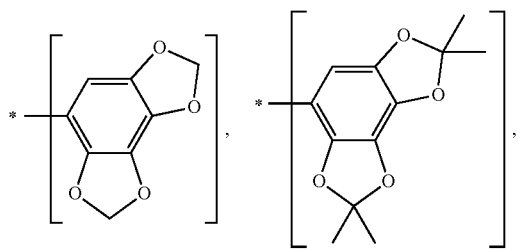,
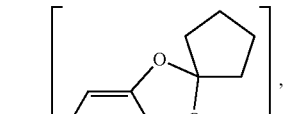,
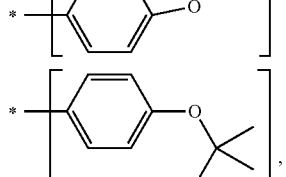,
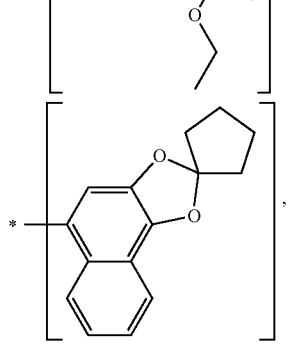,
-continued
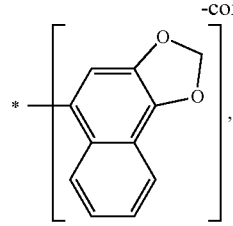,
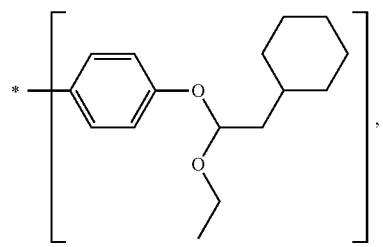,
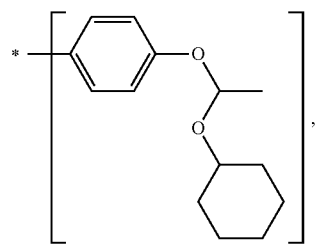,
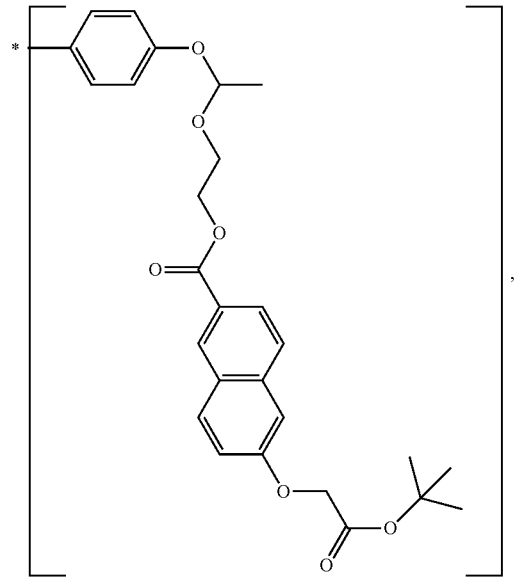,
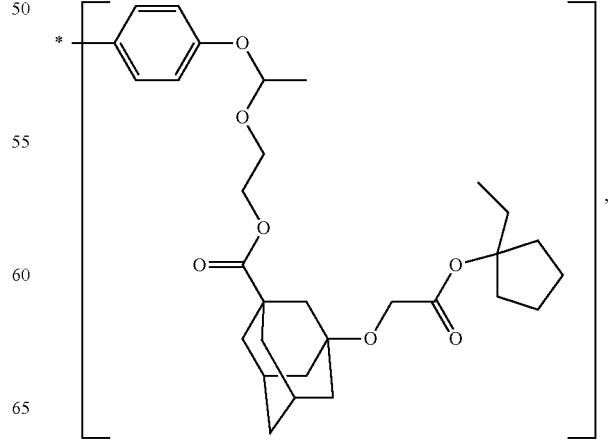, -continued

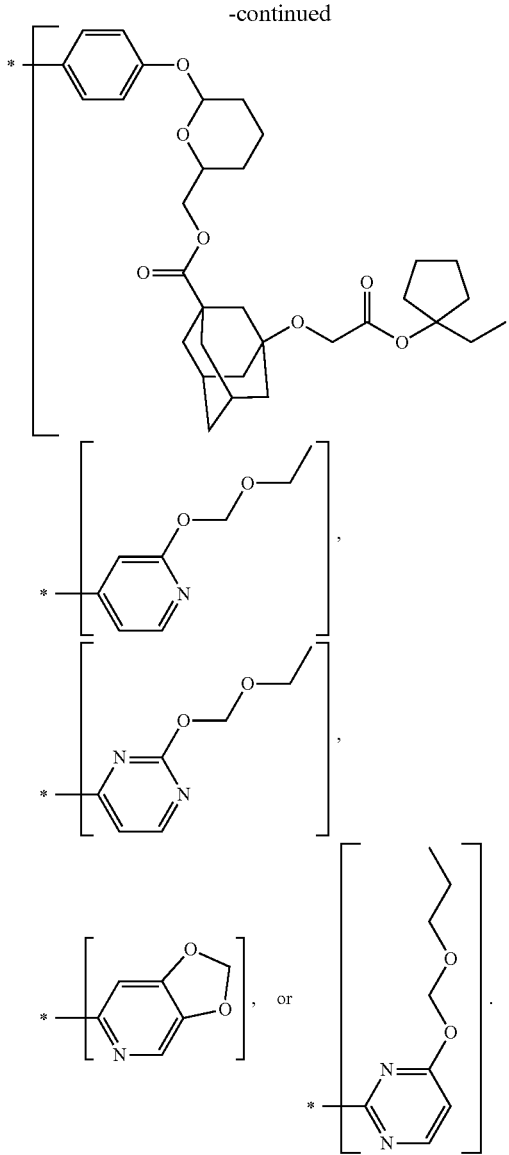

5. The copolymer of claim 4, wherein $R^a$ is hydrogen or methyl.

6. The copolymer of claim 1, wherein the comonomer comprises at least one of the following monomers:
an acid-deprotectable monomer having the formula (II), a lactone-containing monomer of the formula (III), a base-soluble monomer of formula (IV), a photoacid-generating monomer of the formula (V)

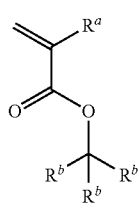 (II)

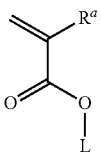 (III)

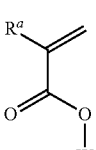 (IV)

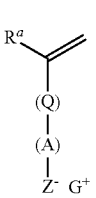 (V)

wherein
each $R^a$ is independently H, F, —CN, $C_{1-10}$ alkyl, or $C_{1-10}$ fluoroalkyl, each $R^b$ is independently $C_{1-20}$ alkyl, $C_{3-20}$ cycloalkyl, $C_{6-20}$ aryl, $C_{3-20}$ heteroaryl, or $C_{7-20}$ aralkyl, and each $R^b$ is separate or at least one $R^b$ is bonded to an adjacent $R^b$ to form a cyclic structure, L is a monocyclic, polycyclic, or fused polycyclic $C_{4-20}$ lactone-containing group, W is a halogenated or non-halogenated, aromatic or non-aromatic $C_{2-50}$ hydroxyl-containing organic group having a $pK_a$ of less than or equal to 12, Q is ester-containing or non-ester-containing and fluorinated or non-fluorinated and is $C_{1-20}$ alkylene, $C_{3-20}$ cycloalkylene, $C_{6-20}$ arylene, or $C_{7-20}$ aralkylene, A is ester-containing or non-ester-containing and fluorinated or non-fluorinated and is $C_{1-20}$ alkylene, $C_{3-20}$ cycloalkylene, $C_{6-20}$ arylene, or $C_{7-20}$ aralkylene, $Z^-$ is an anionic moiety comprising sulfonate, or an anion of a sulfonimide, and $G^+$ is a sulfonium or iodonium cation.

7. A photoresist composition comprising the copolymer of claim 1.

8. A method of forming an electronic device, comprising: (a) applying a layer of the photoresist composition of claim 7 on a substrate; (b) patternwise exposing the photoresist composition layer to activating radiation; and (c) developing the exposed photoresist composition layer to provide a resist relief image.

9. The method of claim 8, wherein the activating radiation is extreme-ultraviolet or electron beam radiation.

* * * * *